United States Patent
Hettler et al.

(10) Patent No.: US 11,128,101 B2
(45) Date of Patent: Sep. 21, 2021

(54) TRANSISTOR OUTLINE PACKAGE WITH GROUND CONNECTION

(71) Applicant: SCHOTT AG, Mainz (DE)

(72) Inventors: Robert Hettler, Kumhausen (DE); Artit Aowudomsuk, Bangkok (TH); Kenneth Tan, Singapore (SG); Karsten Droegemueller, Eichenau (DE)

(73) Assignee: SCHOTT AG, Mainz (DE)

(*) Notice: Subject to any disclaimer, the term of this patent is extended or adjusted under 35 U.S.C. 154(b) by 0 days.

(21) Appl. No.: 16/552,145

(22) Filed: Aug. 27, 2019

(65) Prior Publication Data

US 2020/0067265 A1 Feb. 27, 2020

(30) Foreign Application Priority Data

Aug. 27, 2018 (DE) .................... 10 2018 120 895.2

(51) Int. Cl.
*H01S 5/22* (2006.01)
*H01S 5/023* (2021.01)
*H01S 5/0233* (2021.01)
*H01S 5/0235* (2021.01)

(52) U.S. Cl.
CPC ............ *H01S 5/023* (2021.01); *H01S 5/0233* (2021.01); *H01S 5/0235* (2021.01)

(58) Field of Classification Search
CPC ............ H01S 5/02236; H01S 5/06226; H01S 5/02469; H01S 5/02276; H01S 5/02212; H01S 5/02244; H01S 5/023; H01S 5/0233; H01S 5/0235; H01S 5/02345; H01L 23/045; H01L 23/10; H01L 23/12–15

See application file for complete search history.

(56) References Cited

U.S. PATENT DOCUMENTS

| | | |
|---|---|---|
| 5,557,074 A | 9/1996 | Miyamoto |
| 6,074,102 A | 6/2000 | Oikawa |
| 7,837,085 B1 | 11/2010 | Tziviskos |

(Continued)

FOREIGN PATENT DOCUMENTS

| | | |
|---|---|---|
| DE | 69218122 | 6/1997 |
| DE | 102005056263 | 9/2006 |

(Continued)

OTHER PUBLICATIONS

Shin, "Low-Cost To-Can Header for Coaxial Laser Modules in 25-Gbit/s Transmission Applications", IEEE Transactions on Components, Packaging and Manufacturing Technology, vol. 1, No. 4, Apr. 2011, 9 pages.

*Primary Examiner* — Shahed Ahmed
(74) *Attorney, Agent, or Firm* — Ohlandt, Greeley, Ruggiero & Perle, L.L.P.

(57) ABSTRACT

A transistor outline package is provided that includes a header having an upper surface, a lower surface, an inner surface, and a mounting area for an optoelectronic component in the inner surface. The header has a signal pin configured to connect an optoelectronic component. The signal pin is disposed in a feedthrough and protrudes from the lower surface. A printed circuit board attached on the signal pin substantially coaxially thereto. The printed circuit board is mechanically and electrically connected to the header by a metal block arranged adjacent to the feedthrough to provide grounding.

26 Claims, 20 Drawing Sheets

(56) References Cited

U.S. PATENT DOCUMENTS

| | | | |
|---|---|---|---|
| 8,908,728 B1* | 12/2014 | Huikai | H01S 5/02415 372/36 |
| 2003/0218923 A1 | 11/2003 | Giaretta | |
| 2004/0060727 A1 | 4/2004 | Kojima | |
| 2004/0126066 A1 | 7/2004 | Keh | |
| 2004/0188698 A1 | 9/2004 | Ishimura | |
| 2005/0013561 A1 | 1/2005 | Kuhara | |
| 2005/0018994 A1 | 1/2005 | Riaziat | |
| 2006/0176918 A1 | 8/2006 | Aruga | |
| 2006/0202321 A1 | 9/2006 | Schwiebert | |
| 2006/0247714 A1 | 11/2006 | Taylor | |
| 2007/0065079 A1 | 3/2007 | Mitamura | |
| 2009/0135864 A1* | 5/2009 | Aruga | H05K 1/0243 372/29.02 |
| 2011/0031698 A1 | 2/2011 | Tzviskos | |
| 2012/0207437 A1 | 8/2012 | Kang | |
| 2013/0229201 A1* | 9/2013 | Shah | G01R 31/50 324/756.05 |
| 2014/0029900 A1* | 1/2014 | Logan, Jr. | G02B 6/3822 385/92 |
| 2014/0217570 A1 | 8/2014 | Hettler | |
| 2018/0074988 A1* | 3/2018 | Woosley | G06F 13/385 |

FOREIGN PATENT DOCUMENTS

| | | |
|---|---|---|
| DE | 102013114547 | 7/2014 |
| JP | H05218279 | 8/1993 |
| JP | H0629451 | 2/1994 |
| JP | H11238916 | 8/1999 |
| JP | 2004207259 | 7/2004 |
| JP | 2004356334 | 12/2004 |
| JP | 2005142238 | 6/2005 |
| JP | 2012174917 | 9/2012 |
| WO | 2004044637 | 5/2004 |
| WO | 2005048422 | 5/2005 |

* cited by examiner

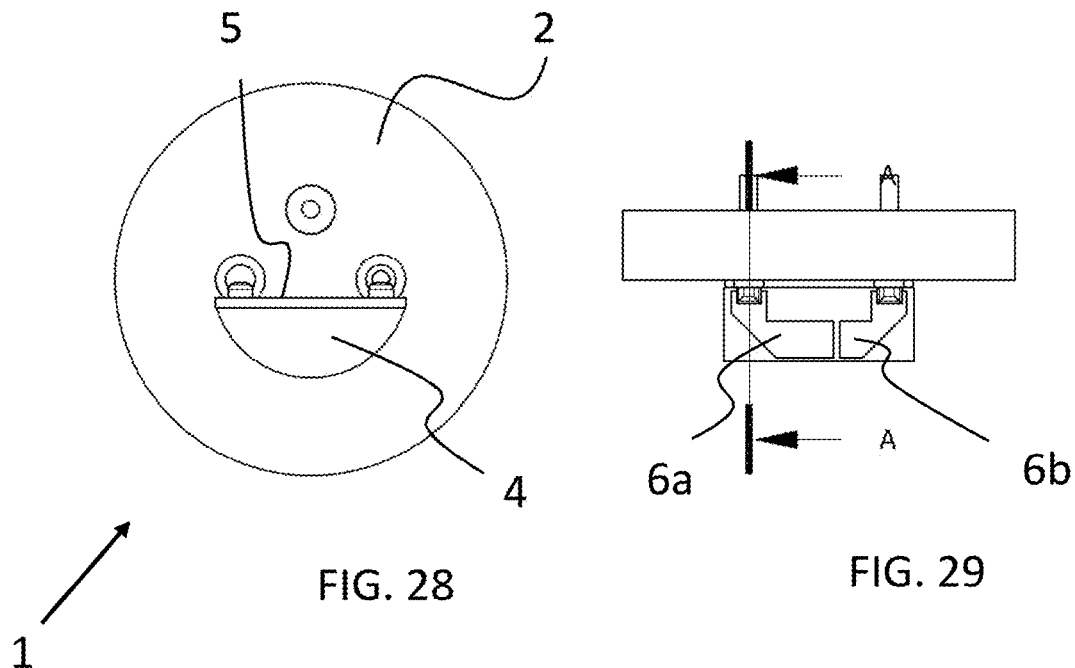
FIG. 28
FIG. 29
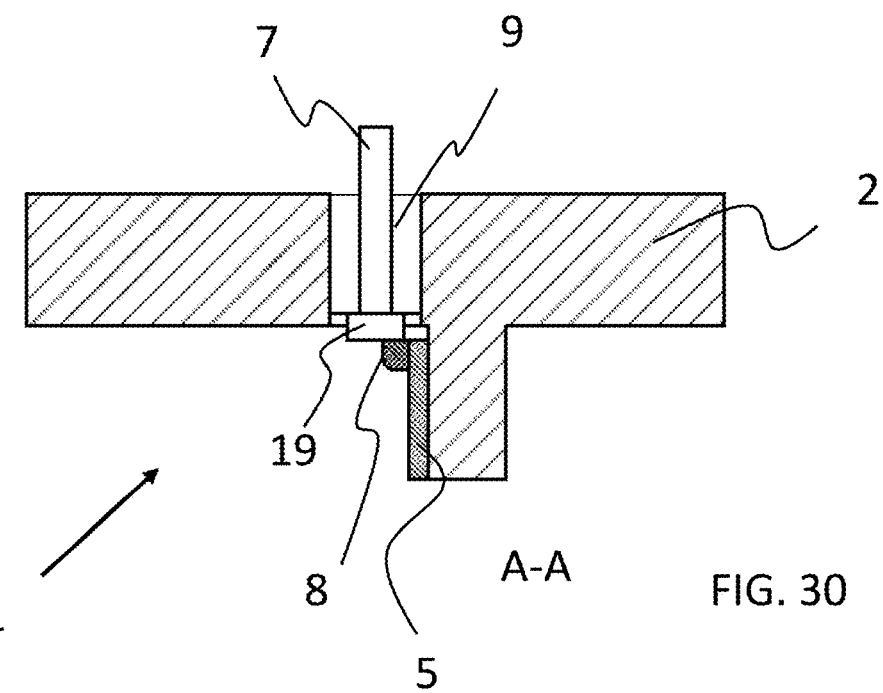
FIG. 30

TRANSISTOR OUTLINE PACKAGE WITH GROUND CONNECTION

CROSS REFERENCE TO RELATED APPLICATIONS

This application claims benefit under 35 USC § 119 of German Application 10 2018 120 895.2 filed Aug. 27, 2018, the entire contents of which are incorporated herein by reference.

BACKGROUND

1. Field of the Invention

The invention relates to a transistor outline (TO) package and to a method for producing same.

2. Description of Related Art

TO packages with glass-sealed signal pins are known. Such a TO package generally comprises a header made of metal, through which at least one signal pin extends which is fitted in a glass feedthrough. The signal pin can be used to electrically connect an optoelectronic component, in particular a laser diode. Such glass feedthroughs, in particular fused glass feedthroughs, allow to provide, in a simple manner, hermetically sealed packages with high temperature resistance.

Currently, data transfer rates of 25 Gbit/s per channel are common in the 100 G Internet standard. In order to reach the next Internet standard 400 G, the data transfer rate has to be approximately doubled to achieve about 100 Gbit/s per wavelength.

At the same time, this requires a doubling in the bandwidth and in the transmission frequency.

The area of glass feedthroughs of a TO package is problematic because of the jump in impedance of the signal line that is always caused due to the glass insulating material which has a different permittivity than air. Such a jump in impedance can be compensated for, for example, by a projection of the signal pin on the lower surface of the package.

A drawback of prior art TO packages known from practice is their low tolerance with respect to tolerances in shape and position of the pins, especially if two signal pins are provided. In particular glass-sealed pins may be subject to positional tolerances such as angular offset of the pin in the feedthrough.

It is difficult to compensate for this when a pin for providing a ground connection is to be connected at the same time, in one process step.

SUMMARY

The invention is therefore based on the object to mitigate the mentioned drawbacks of the prior art. A particular object of the invention is to provide a TO package that is assembled more easily and allows for higher data transfer rates, and uses of such a TO package.

The invention relates to a TO package which comprises a header having an upper surface which, once a cap has been attached, defines an inner surface of the then hermetically sealed TO package, and a lower surface, and having a mounting area for an optoelectronic component in the interior of the TO package.

Generally, the fully assembled package consists of a header preferably made of metal, on which a cap is attached, in particular soldered thereto, which is preferably also made of metal and has a window.

The mounting area for the optoelectronic component is provided in the so defined interior.

The TO package is hermetically sealed and comprises at least one signal pin that is disposed in a feedthrough and protrudes from the lower surface thereof, for connecting the electronic component.

The signal pin is used to drive or read out the optoelectronic component which is in particular implemented as a laser diode. The invention in particular relates to optoelectronic components, and the TO package has two signal pins each one preferably being fitted in a feedthrough.

Due to the high data transfer rates and the associated high transmission frequency, a uniform impedance profile of the signal path is important, including the feedthrough, inter alia.

According to one aspect of the invention, a printed circuit board is attached to the signal pin substantially coaxially thereto, and the printed circuit board is mechanically and electrically connected to the header by at least one metal block arranged adjacent to the feedthrough, to provide grounding.

So, in contrast to most TO packages known from practice, the printed circuit board is not connected to the signal pin perpendicular thereto, but is arranged coaxially to the signal pin.

Furthermore, instead of a pin for providing a ground connection, a metal block is provided which provides an angle, in particular a right angle, and so connects the printed circuit board, in particular a ground conductor trace of the printed circuit board, to the lower surface of the header, mechanically and electrically.

In addition to the mechanical connection and the electrical ground connection, the metal block provides shielding of the adjacent signal pin protruding from the feedthrough.

Preferably, the signal pin does not protrude beyond the metal block.

The metal block is in particular provided in the form of a plate.

Preferably, the metal block has a thickness of more than 0.1 mm, most preferably of more than 0.5 mm, and/or of less than 5 mm, most preferably of less than 2 mm.

The metal block may extend over a large part of the diameter of the header, in particular over at least 20%, preferably over at least 50% of the diameter of the header.

In addition to the shielding and the more stable mechanical connection of the printed circuit board, the use of the metal block moreover decouples the soldering of the one or more signal pins from the providing of a ground connection.

In this way, positional tolerances of the signal pins can be better compensated for, and subsequently the ground connection can be established by soldering the metal block to the printed circuit board and/or to the lower surface of the header, while shape and positional tolerances do not play a major role due to the preferably plate-shaped design of the metal block.

The metal block is in particular in the form of a solid metal plate.

However, it is also conceivable to use a dielectric material which is provided with a metal layer.

In a preferred embodiment of the invention, the metal block is in the form of a bridge which extends over the signal pin disposed in the feedthrough. It is in particular suggested that the bridge has two arches, each one extending over a signal pin. In this way, optimum shielding can be provided for the signal pins that protrude from the lower surface of the header.

In an alternative embodiment of the invention, however, it is also conceivable to use, instead of a single metal block, a plurality of metal blocks each one adjacent to a lateral surface of the signal pin.

The printed circuit board is preferably in the form of a flexible printed circuit board. For example, it may be angled, for example bent about 90°, to be connected to an electronic module.

In a refinement of the invention, the printed circuit board is provided with a stiffener below the metal block. In the assembled state, the stiffener is arranged below the metal block and thus stabilizes the printed circuit board. So it is possible in particular in a simple manner to connect a flexible printed circuit board with the metal block with good mechanical stability.

The printed circuit board is preferably implemented as a multi-layer board, with a ground conductor being provided below a signal conductor trace and/or between the signal conductor traces.

Preferably, the TO package comprises at least two, preferably exactly two signal pins, each one arranged in a respective feedthrough.

The mounting area is preferably provided on a submount which is electrically connected via at least one signal pin, preferably via two signal pins.

The submount is preferably made of a dielectric material, in particular a ceramic, in particular of aluminum oxide or aluminum nitrite, or of glass or silicon.

Preferably, the submount sits on a pedestal of the header. The pedestal may be formed integrally with the rest of the header, for example, or may be mounted to the header as a separate part.

In particular, the header with the pedestal may be formed as a stamped metal part.

The header is preferably made of metal and is provided with a coating, in particular a gold coating.

In a preferred embodiment of the TO package according to the invention, the signal pin is arranged adjacent to a submount for the optoelectronic component, and the signal pin is arranged in the feedthrough eccentrically offset toward the submount.

According to one embodiment of the invention, the feedthrough of the signal pin is filled with an insulating material made of glass and/or glass ceramic, wherein on at least one side of the feedthrough there is an area in which the feedthrough is not filled with the insulating material made of glass and/or glass ceramic but is recessed. So, the glass and/or glass ceramic insulating material is spaced from the upper and/or lower surface of the header.

It has been found that due to the fact that the feedthrough is only partially filled with the glass and/or glass ceramic insulating material it is possible to minimize the influence of variations in the filling volume.

In particular meniscus formation can be largely avoided, most importantly meniscus formation beyond the lower or upper surface of the header and/or along the signal pin.

In the recessed area, the signal pin may have an enlarged portion. The enlarged portion may in particular be in the form of a collar.

This allows for impedance adjustment, since the thicker collar at least partially compensates for the lower permittivity in the recessed area.

Furthermore, according to one embodiment of the invention it is contemplated that the area of the feedthrough in which no glass and/or glass ceramic insulation material is provided is filled up with a plastic, in particular with an epoxy resin.

In terms of processing, the filling with a plastic that can be cured, for example thermally or by light, is easier, without the risk that the plastic will protrude beyond the feedthrough.

Preferably, a glass and/or glass ceramic insulating material is used which has a low relative permittivity $\varepsilon_r$ (at 18° C. and 50 Hz) of less than 6.0, preferably less than 5.0.

According to another embodiment, a glass or a glass ceramic is used which has a higher permittivity, in particular a permittivity $\varepsilon_r$ between 5.0 and 8, preferably between 6.5 and 7. Such glasses are particularly suitable for compression glass feedthroughs, i.e. feedthroughs in which the glass is under a thermally induced mechanical compressive stress.

The permittivity of the plastic optionally introduced into the area not filled with glass and/or glass ceramic is preferably matched to that of the glass. In particular, the permittivity of the plastic corresponds to that of the insulating material made of glass +/−1.0.

According to one embodiment of the invention, the printed circuit board may be thickened adjacent to the lower surface of the TO package.

It is in particular contemplated that the thickened portion of the printed circuit board is in the form of a multi-layer board, in particular a rigid printed circuit board which merges into a flexible printed circuit board.

The thickened multi-layer portion may be used to provide additional connections, for example for a monitor diode.

Furthermore, the thickened portion may at the same time define the stiffener described above.

The invention furthermore relates to a kit for providing the TO package described above.

This kit comprises at least one header including at least one signal pin disposed in a feedthrough, and a metal block for connecting the header to a printed circuit board.

The metal block may be connected to the printed circuit board already in the delivered state, or it may be supplied as a separate component.

According to a further embodiment of the invention, the metal block is formed integrally with the header, in particular as a one-piece stamped part.

Due to the decoupling of the soldering of the signal pins and the providing of the ground connection, it is particularly easily possible to compensate for positional tolerances of the signal pins.

Accordingly, the invention also relates to a method for assembling a TO package as described above, wherein first the at least one signal pin is connected to the printed circuit board and then the metal block is connected to the header and to the printed circuit board for providing a ground connection.

The invention furthermore relates to a TO package which may in particular be configured as described above, and/or which may comprise further individual features of the TO package described above, in addition to the features described below.

The TO package comprises a header with a mounting area for an optoelectronic component.

Furthermore, the header comprises a signal pin arranged in a feedthrough for connecting the optoelectronic component. The feedthrough is in particular filled with an insulating material comprising glass and/or glass ceramic.

As described above, a hermetically sealed electronic feedthrough is provided in this way.

According to the invention, the signal pin comprises an enlarged portion, and at least a section thereof is arranged within the feedthrough.

According to one embodiment of the invention, the enlarged portion is substantially flush with the upper surface of the header adjacent to the feedthrough.

This is understood to mean that the enlarged portion which may have a circular cylindrical shape, for example, substantially terminates at the level of the upper surface of the header. Thus, the front face of the enlarged portion facing the interior of the package lies in the same plane as the adjacent upper surface of the header.

It will be understood that a certain tolerance is possible as to the level of the enlarged portion. So, in the context of the invention, a level offset of +/−0.5 mm, preferably +/−0.2 mm is still understood as lying in the same plane.

In particular an enlarged portion that lies at a level of not more than 0.5 mm, preferably not more than 0.2 mm higher may have advantages in terms of manufacturing, since the enlarged portion may be placed in a holder before being glass sealed, for example.

According to another embodiment of the invention, the enlarged portion may as well protrude into the package, although this may complicate electrical connection at the front face.

However, what is essential here is that the enlarged portion allows to reduce the gap width in the region of the upper surface of the header, and/or to be able at all to connect the conductor traces of the submount to the enlarged portion at the front face thereof, as will be explained in detail below.

According to a preferred embodiment of the invention, the signal pin is connected to a submount or to the conductor trace of a submount by an electrically conductive material. In particular a solder is used as the electrically conductive material. Alternatively, an electrically conductive plastic can be used, such as a conductive epoxy resin.

The signal pin is connected two-dimensionally to the conductor trace of the submount, by means of the electrical conductive material. That is to say, no bonding wire is used to contact the submount.

In this way, a mechanically stable connection is provided, while variations in impedance are reduced.

Two preferred embodiments are suggested for electrically connecting the signal pin.

According to a first embodiment of the invention, the signal pin is connected to the submount on a lateral surface thereof.

For this purpose, the signal pin may in particular have a projection adjacent to the enlarged portion. The projection is connected to the submount at a lateral surface thereof. Thus, the projection defines a soldering lug.

According to another embodiment of the invention, the signal pin is electrically connected on the front face thereof. In this embodiment of the invention, the signal pin preferably terminates with the enlarged portion. Thus, the signal pin is T-shaped in longitudinal section.

Preferably, at least the front face of the enlarged portion facing the interior of the package is flat.

When the TO package has a cap attached thereto, the upper surface of the header is located inside the TO package.

When mounting the optoelectronic component, a submount may be placed on the upper surface.

It is in particular contemplated that the submount is placed on a pedestal which extends from the upper surface and perpendicular into the TO package.

With the enlarged portion substantially flushing with the upper surface it is possible for a submount to partially overlie the enlarged portion. This allows to reduce the gap width between a signal conductor trace of the submount and the connection area of the signal pin and/or to reduce the variance of the gap width caused by component tolerances, compared with a submount that is located laterally adjacent to the signal pin.

It is possible to use less solder, and the spread of the resistance value of the solder area is reduced.

Furthermore, the return loss can be improved by this embodiment.

The submount, in particular at least one conductor trace of the submount, may in particular be arranged directly adjoining the front face of the enlarged portion.

The invention furthermore relates to a TO package in particular having one or more of the features described above.

The TO package has a header with a mounting area for an optoelectronic component, and the TO package comprises a submount for the optoelectronic component, and the header comprises at least one signal pin disposed in a feedthrough, for connecting the optoelectronic component.

For connecting the signal pin to the optoelectronic component, in particular to the submount, it is contemplated according to one embodiment of the invention that the signal pin has a connection area for the optoelectronic component at a front face thereof, which is in particular defined by a front face of the enlarged portion.

So, according to the invention the front face of the signal pin, in particular the front face of the enlarged portion is used as a connection area for the submount.

The signal conductor traces of the submount are in particular aligned coaxially with the signal pins, wherein an end of the conductor trace sits on the front face of the signal pin perpendicular thereto.

Thus, a corner is provided between the conductor trace of the submount serving as a signal conductor trace and the connection area of the signal pin, in which a solder fillet may be provided to establish an electrical connection.

According to the other embodiment which does not relate to the front face connection, but in which the signal pin is rather contacted laterally, the signal pin may moreover have an extension extending beyond the enlarged portion and into the interior of the package. The signal conductor trace of the submount can be connected laterally to this extension. In this case, the extension serves as a soldering lug.

In this case, at least one conductor trace of the submount extends coaxially with the signal pin as well.

According to the first embodiment described above, the coaxially extending conductor trace may be connected, in particular soldered to a front face of the signal pin.

According to a preferred embodiment of the invention, the submount comprises two conductor traces which extend coaxially with two signal pins.

According to a further aspect, the invention relates to a TO package in particular having one or more of the features described above.

The TO package has a header with a mounting area for an optoelectronic component, and the TO package comprises a submount for the optoelectronic component, wherein the header comprises at least one signal pin disposed in a feedthrough, for connecting the optoelectronic component.

According to the invention, the submount has a thinned area on a front end thereof, in particular at least below at least one conductor trace extending coaxially with a signal pin, which thinned area is provided with a ground conductor trace. The non-thinned area also has a ground conductor trace. This ground conductor trace is electrically connected to the ground conductor trace of the thinned area.

The submount is in particular implemented as a multi-layer printed circuit board, and an upper surface of the submount provides the at least one conductor trace serving as a signal conductor trace, and a lower surface of the submount comprises a ground conductor trace.

According to the aspect of the invention defined above, the submount is designed so as to be thinner at a front end thereof adjacent to the signal pin, so that the ground conductor trace comes closer to the at least one signal conductor trace.

Thus, a step is provided in the thickness of the submount, the submount has thinner areas in a front end region.

It is in particular contemplated that in the thinned area the thickness of the submount is reduced by at least 20% compared to an adjacent area.

The thinned area may be provided by a recess of the submount at the edge thereof, in particular a recess of rectangular cross section. Alternatively, a V-shaped recess may be provided, for example by a saw blade.

Such recess may have a width and/or height between 0.1 and 0.3 mm, in particular in the case of a parallelepipedal design, and/or may cover the entire length of the edge of the submount.

It has been found that this allows to reduce the impedance in a simple way.

According to a further refinement of the invention, the feedthrough has a step below an upper surface of the header.

So, due to the step the diameter of the feedthrough is reduced adjacent to the upper surface of the package compared to the rest of the feedthrough.

It is in particular contemplated that the diameter of the feedthrough above the step is smaller by at least 10% than below the step.

With the step and the associated portion of reduced diameter of the feedthrough, the capacitance of the signal path can be increased locally.

In a further embodiment of the invention, the feedthrough may have a covering made of dielectric material on at least one side thereof.

The covering may in particular be in the form of a perforated glass, ceramic, and/or glass ceramic disk. Such a covering is useful to reduce the wicking of the insulating material along the signal pin during manufacture. When a fused glass is employed for the feedthrough, this in particular allows to largely avoid wetting of the signal pin with glass above the feedthrough.

In a further embodiment of the invention, a first glass and/or glass ceramic insulating material is used as the insulating material, and in the region of the upper surface of the header, a further insulating material is arranged adjacent to that insulating material, which has a relative permittivity $\varepsilon_r$ (at 18° C. and 50 Hz) that is greater than that of the first insulating material.

So, in this embodiment of the invention the feedthrough comprises two areas in which the permittivity $\varepsilon_r$ of the insulating material is different.

Adjacent to the upper surface of the header, the insulating material has a greater relative permittivity than in the rest of the feedthrough.

In this way, the capacity of the feedthrough can be increased locally.

The further insulation material with the higher relative permittivity is preferably a higher melting material than the first insulation material.

In particular the covering described above may define the further insulating material.

The invention allows to provide a device for data transfer at a data transfer rate of at least 100 Gbit/s per wavelength, which comprises at least one TO package as described above.

BRIEF DESCRIPTION OF THE DRAWINGS

The subject-matter of the invention will now be explained in more detail by way of exemplary embodiments and with reference to the drawings of FIGS. 1 through 30.

FIGS. 28 to 30 illustrate an embodiment of a TO package in which the signal pin has an enlarged portion that is only partially arranged in the feedthrough.

DETAILED DESCRIPTION

Figure 1:
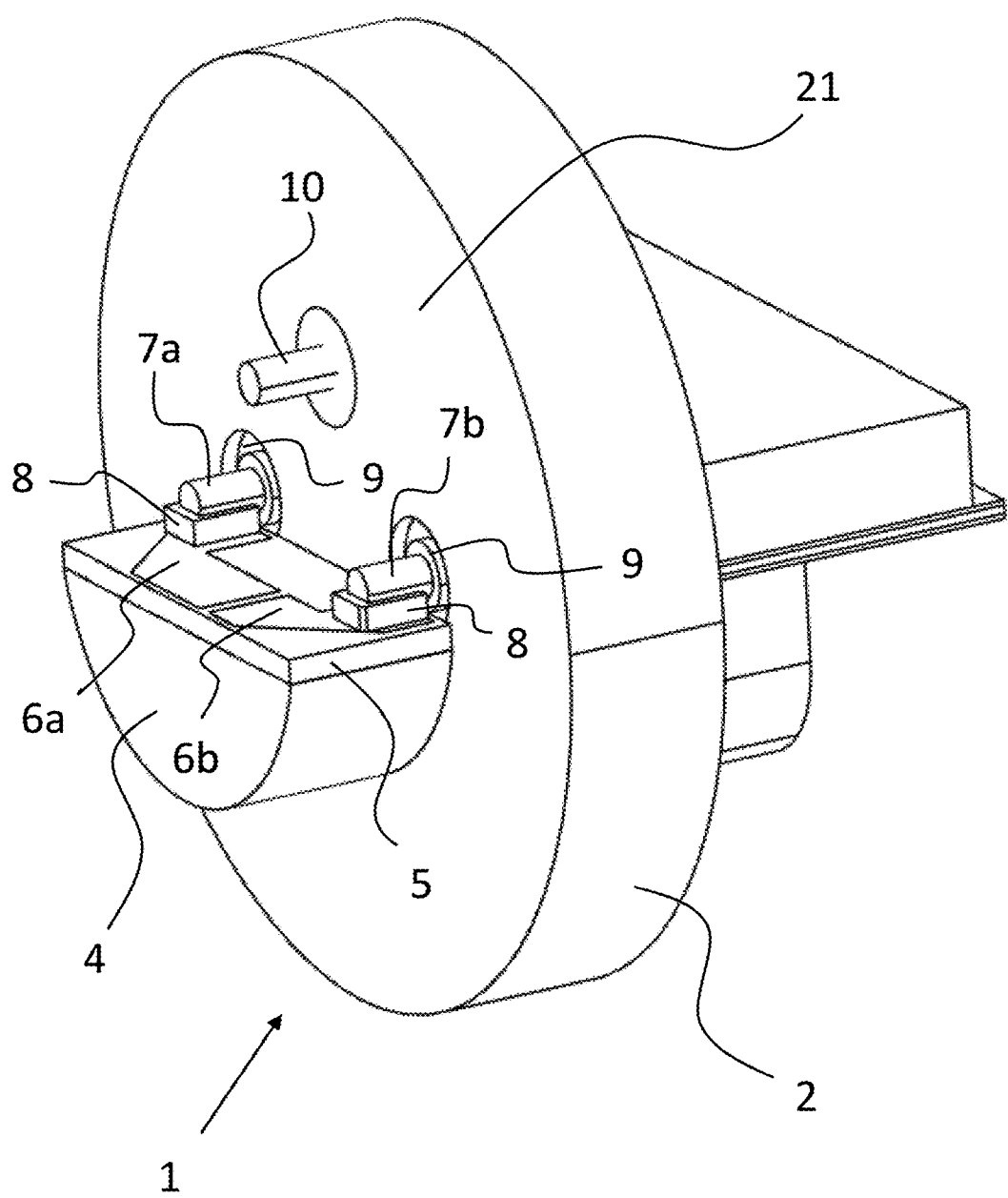
FIGS. 1 to 4 are perspective views of an exemplary embodiment of a TO package according to the invention (without cap).

FIG. 1 is a perspective view of a TO package 1 according to the invention.

TO package 1 comprises a header 2. In the present exemplary embodiment, the header 2 has a circular cross-sectional shape. Preferably, the header 2 is made of metal, in particular of a metal that is provided with a coating, for example a gold coating.

In this exemplary embodiment, the header 2 includes the two signal pins 7a, 7b which extend through the header 2 via feedthroughs 9.

The header 2 has an upper surface 21 which, once a cap has been attached, defines an inner surface of the then hermetically sealed TO package 1.

Signal pins 7a, 7b are connected to the conductor traces 6a, 6b by means of a solder 8.

Conductor traces 6a, 6b serve to electrically connect an optoelectronic component, in particular a laser diode (not shown). So, this exemplary embodiment of the invention is provided for a laser diode having two signal conductor paths.

Conductor traces 6a, 6b are provided on a submount 5 which in turn is mounted on a pedestal 4 that protrudes from the upper surface 21 of the header 2.

Preferably, the pedestal 4 is formed integrally with the header. Header 2 and pedestal 4 may in particular be formed as a one-piece stamped part.

In this exemplary embodiment, the pedestal 4 has a cross-sectional shape of a circular segment. However, it is also conceivable for the pedestal 4 to have a different design, for example with a rectangular cross-sectional shape.

Submount 5 is aligned coaxially with the signal pins 7a, 7b, so that in the assembled state the lower surface of the laser diode is aligned perpendicular to the upper surface 21 of the header 2.

Submount 5 is preferably made of a ceramic. For example an aluminum oxide ceramic may be used. Preferably, the submount 5 is made of an aluminum nitrite ceramic. The latter exhibits high thermal conductivity.

In addition to the signal pins 7a, 7b, the TO package 1 comprises at least one further pin 10 in this exemplary embodiment. This pin can be used for connecting a monitor diode, for example. It will be appreciated that other embodiments of the invention may include further pins, for example for driving a thermoelectric cooler (not shown).

Figure 2:
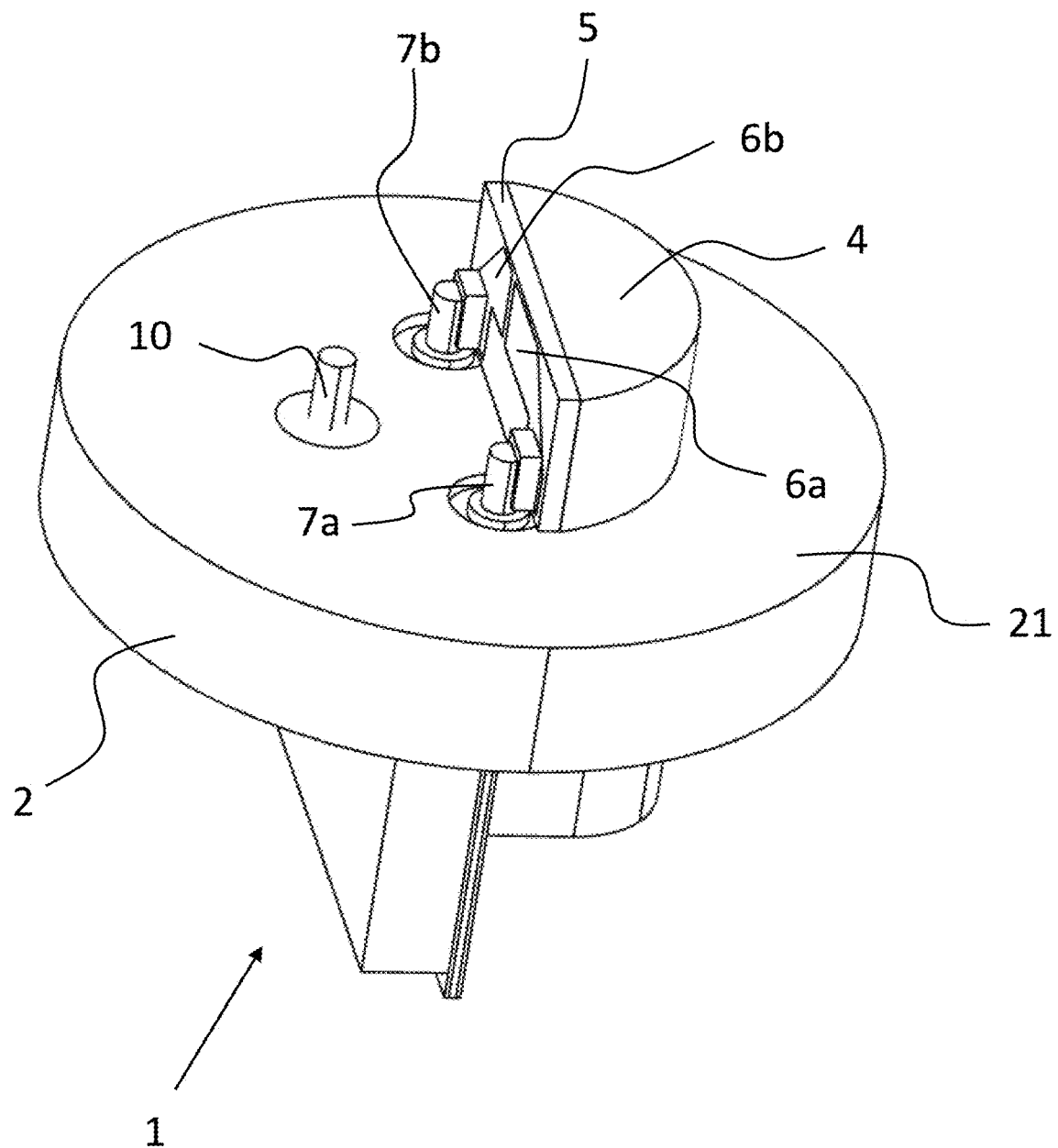

FIG. 2 is another perspective view of the TO package 1.

It can in particular be seen that the signal pins 7a, 7b and the pin 10 protrude perpendicularly from the upper surface of the header 2.

The same is true for the pedestal 4 with submount 5.

Signal pins 7a, 7b are combined coaxially to the conductor traces 6a, 6b. The conductor traces 6a and 6b on the submount 5 approach each other, so that an optoelectronic component can be placed directly on a conductor trace 6a and can be electrically connected to the other conductor trace 6b by a bonding wire.

Figure 3:
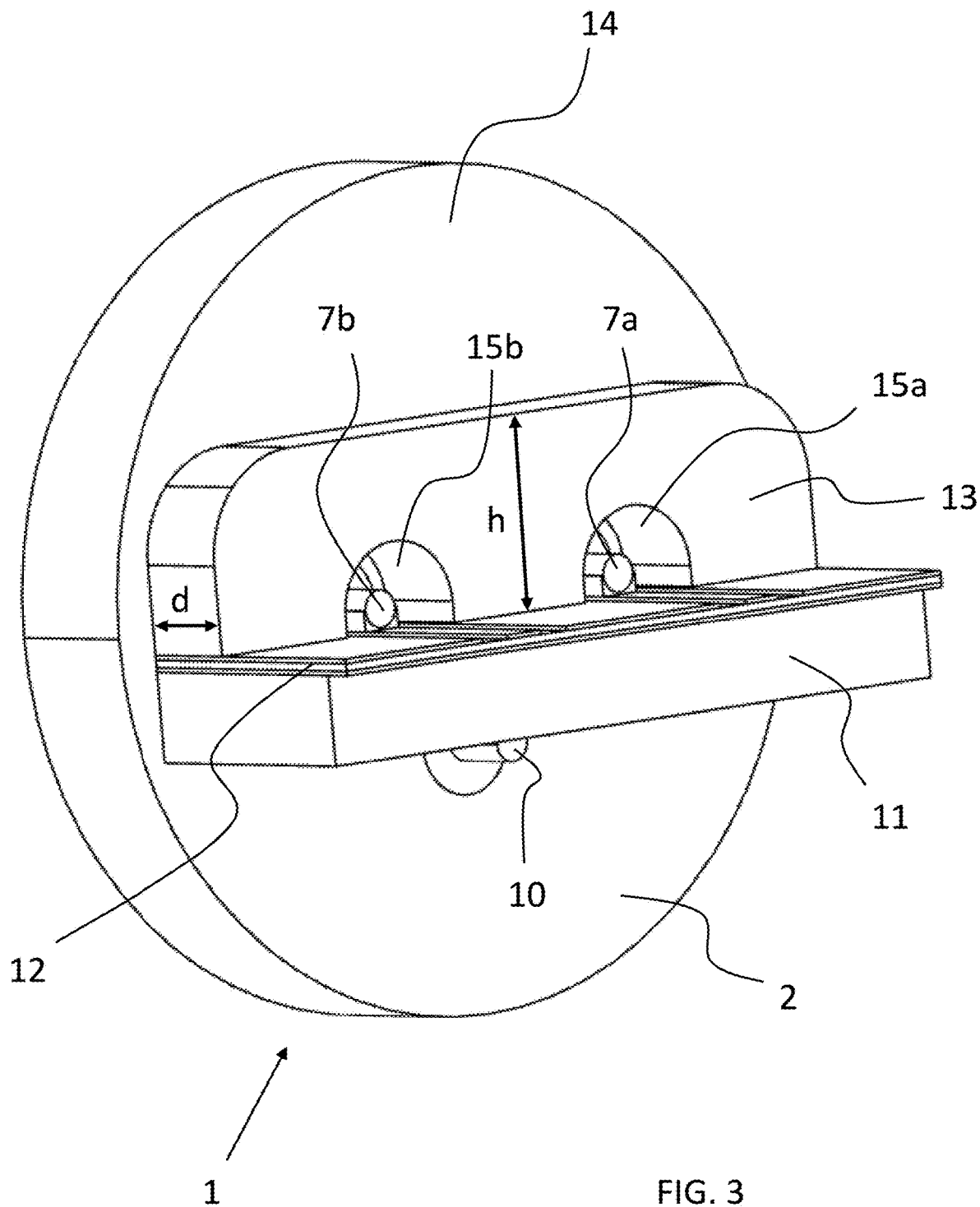

FIG. 3 is another perspective view of the TO package 1 illustrating the lower surface 14 of the TO package.

Signal pins 7a, 7b can be seen protruding from the lower surface 14.

Signal pins 7a, 7b are connected to a printed circuit board 12.

Printed circuit board 12 is only partially shown in this view. The printed circuit board 12 may, for example, be implemented as a flexible printed circuit board and may be angled to be connected to an electronic module (not shown).

Printed circuit board 12 is provided with a stiffener 11 on its lower surface. The stiffener 11 is preferably made of a dielectric material, for example of a plastic or ceramic material.

What is achieved with the stiffener 11 is, for example, that even a flexible printed circuit board 12 will be stiff and stable adjacent to the lower surface 14 of the header 2.

In order to establish a stable mechanical connection and a ground connection between the header 2 and the printed circuit board 12, a metal block 13 is provided and is connected, in particular soldered, to the printed circuit board 12 on the one side and to the lower surface 14 of the header 2 on the other side.

Metal block 13 defines an angle which allows for a coaxial arrangement of the printed circuit board 12 relative to the signal pins 7a, 7b.

In this exemplary embodiment, the metal block 13 is in the form of a bridge spanning each of the signal pins 7a, 7b with a respective arch 15a, 15b.

Signal pins 7a, 7b preferably do not project beyond the metal block 13.

Figure 8:
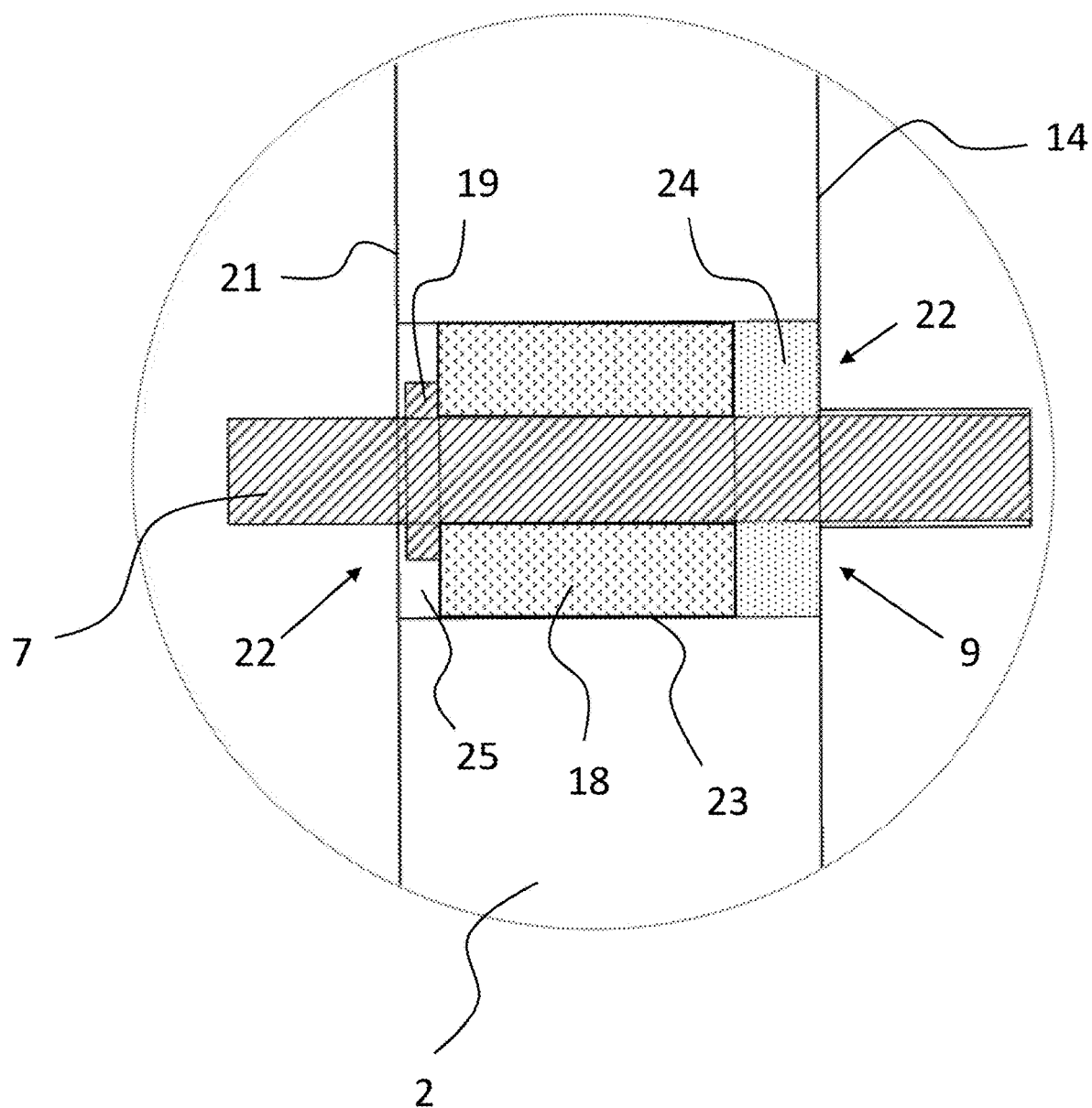
FIG. 8 is a sectional detail view through a feedthrough of the header.

In the region of the arches 15a, 15b, the metal block 13 may protrude into the range of the feedthrough (9 in FIG. 1 and FIG. 8).

With the metal block 13, signal pins 7a, 7b are also shielded outside the feedthrough.

Metal block 13 preferably has a plate-like shape.

Metal block 13 provides for a ground connection both between the signal pins 7a, 7b and next to the signal pins 7a, 7b.

Metal block 13 preferably has a thickness d of more than 0.1 mm, most preferably of more than 0.5 mm, and/or of less than 5 mm, most preferably of less than 2 mm.

In width direction, the metal block 13 may extend over a large part of the diameter of the header 2, in particular over at least 20%, preferably over at least 50% of the diameter of the header 2.

The height h of metal block 13 preferably corresponds to at least 1.5 times the diameter of the feedthrough.

In addition to providing a stable mechanical connection of the printed circuit board 12, the metal block 13 also has the advantage that the bonding of the signal pins 7a, 7b to the printed circuit board 12 is decoupled from the establishing of the ground connection.

So, for example, the signal pins 7a, 7b may be soldered first to the printed circuit board 12.

Since there will be no other mechanical connection to the printed circuit board 12 existing at this point in time, shape and positional tolerances can be well compensated for.

In the next step, the metal block 13 can be connected to the header 2 and/or to the printed circuit board 12 to establish a ground connection.

Furthermore, it can be seen that a further pin 10 is provided on the side of the printed circuit board 12 opposite the signal pins 7a, 7b. The further pin 10 is also disposed in a feedthrough and is used for connecting a monitor diode in this embodiment.

The further pin 10 is connected to the stiffener 11 which serves as a printed circuit board 1 at the same time.

Figure 4:
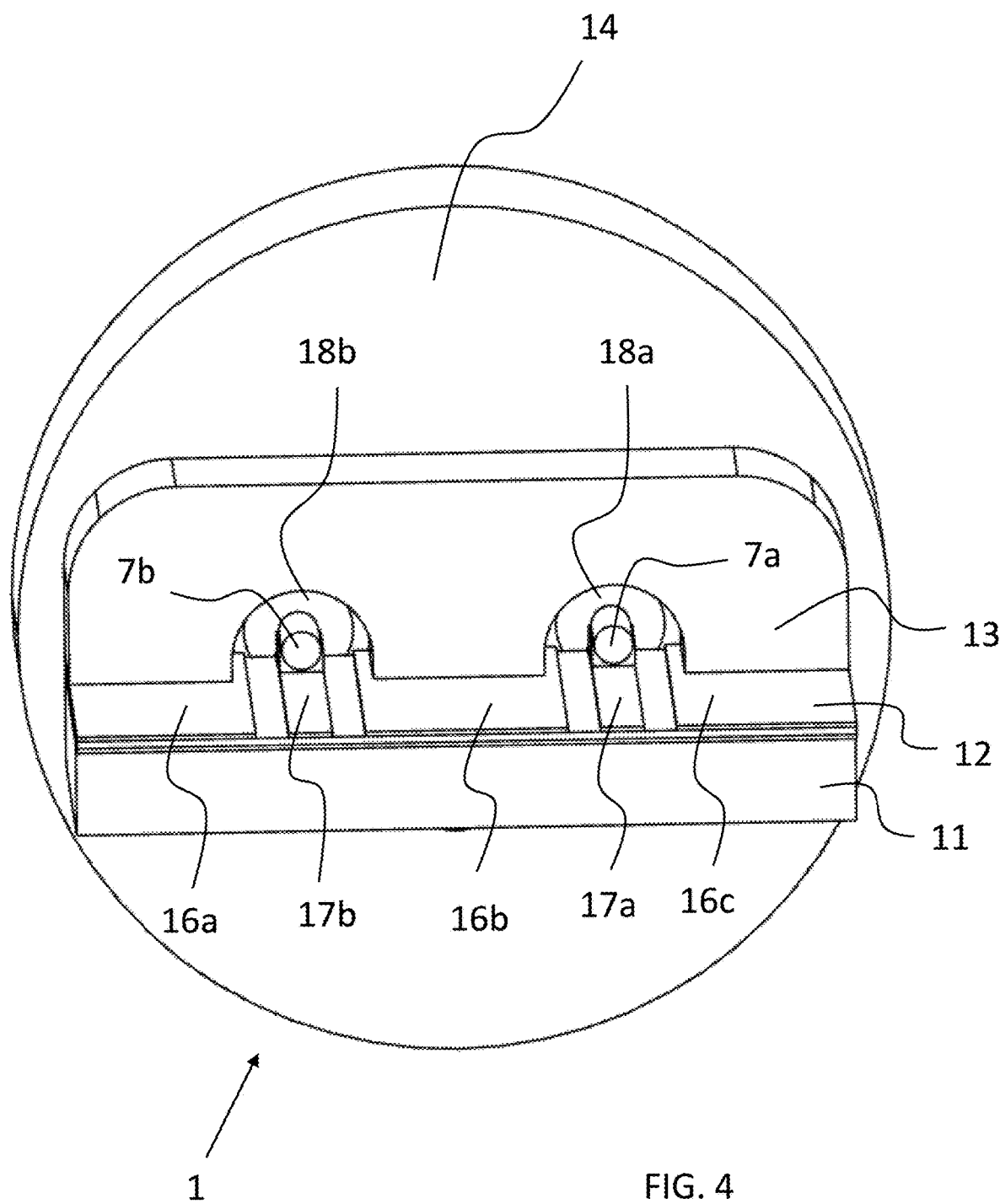

FIG. 4 is another perspective view of the lower surface 14 of the TO package.

It can be seen that the signal pins 7a, 7b are embedded in an insulating material made of glass 18a, 18b.

Signal pins 7a, 7b protrude from the lower surface 14 through the feedthroughs formed in this way.

The signal pins 7a, 7b are coaxially connected to signal conductor traces 17a, 17b of the printed circuit board 12.

Between signal conductor traces 17a, 17b on the printed circuit board 12, the ground conductor trace 16b is provided. Ground conductor traces 16a and 16c are arranged next to the signal conductor traces 17a, 17b on either side thereof. Thus, the signal conductor traces 17a, 17b are shielded from both sides.

Figure 5:
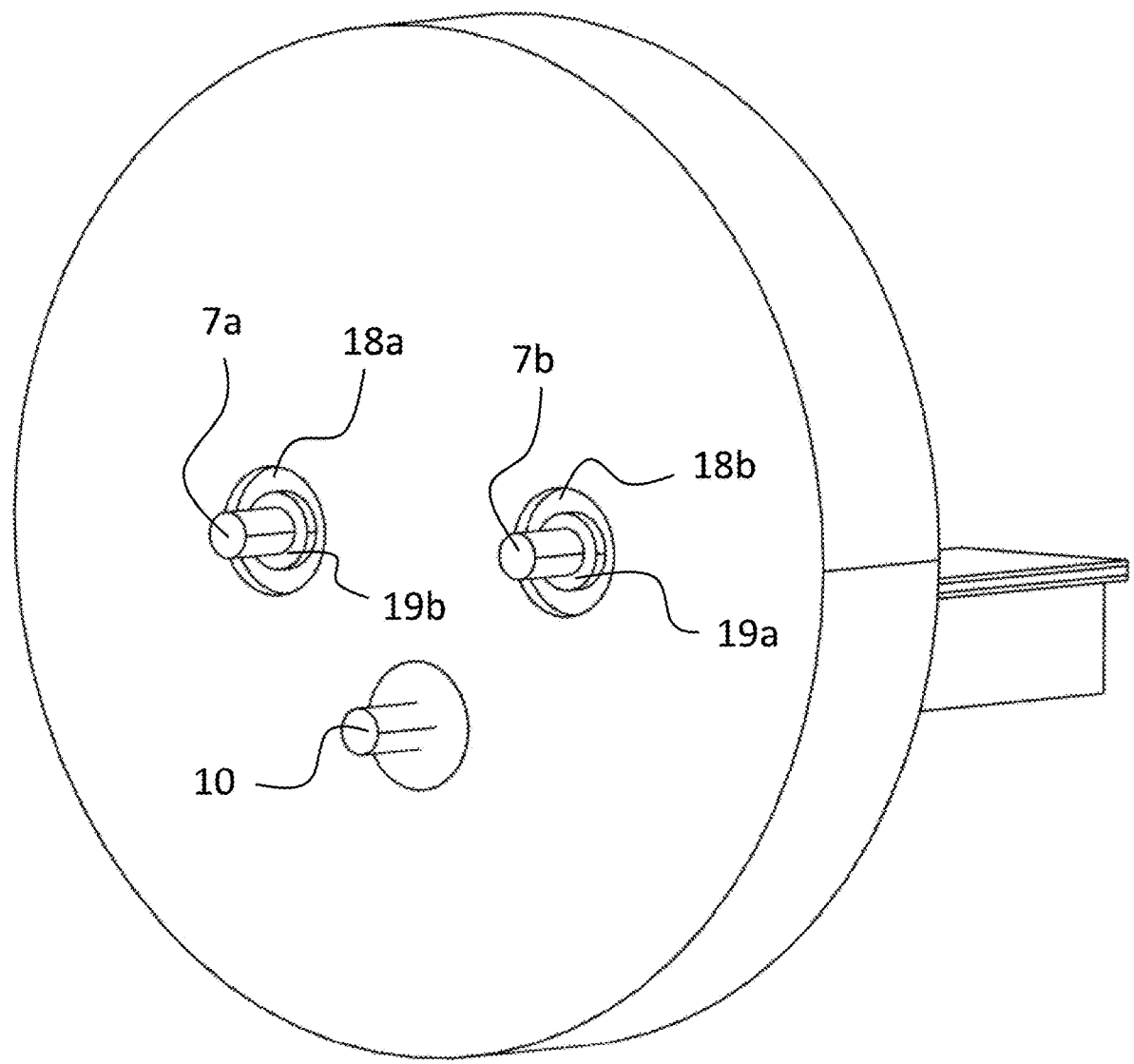
FIG. 5 is a perspective view of the inner surface of the package without submount.

FIG. 5 is a view of the inner surface of the TO package, in which the pedestal and the submount have been omitted.

It can be seen in this view that the signal pins 7a, 7b embedded in the insulating material made of glass 18a, 18b each have an enlarged portion 19a, 19b on the inner side. In the area of these collar-shaped enlarged portions 19a, 19b, there is a region without insulating glass material. The jump in impedance caused thereby is at least partially compensated for by the enlarged portions 19a, 19b.

Figure 6:
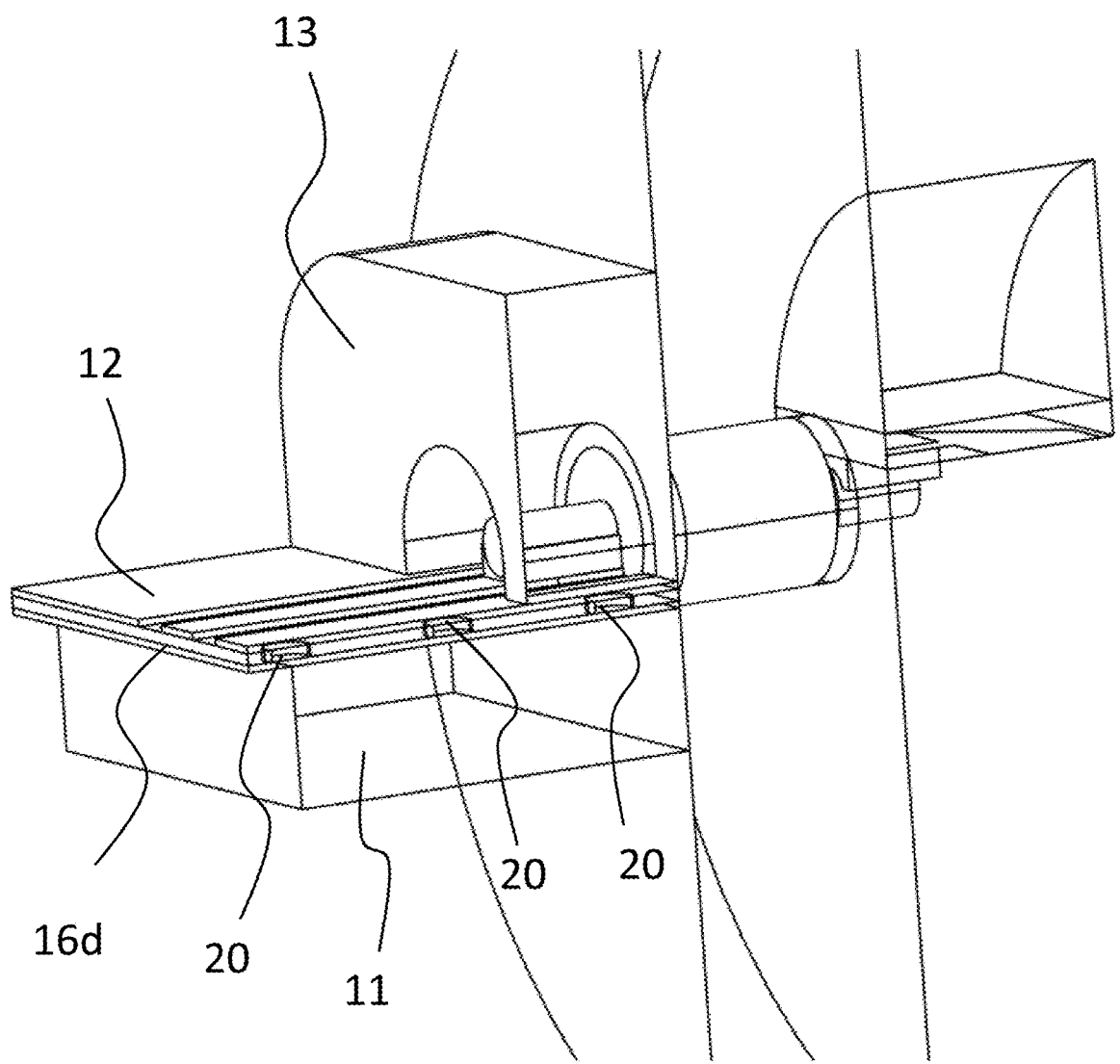
FIG. 6 is a detail view, partially cut away, which illustrates details of the printed circuit board.

FIG. 6 is a cutaway perspective view in which it can be seen that the printed circuit board 12 is configured as a multi-layer printed circuit board.

On the upper surface, the printed circuit board 12 comprises the signal conductor traces 17a, 17b illustrated in FIG. 4 and the ground conductor traces 16a to 16c.

Ground conductor traces 16a to 16c are connected, through vias 20, to an underlying ground conductor trace 16d which also extends below the signal conductor traces 17a, 17b shown in FIG. 4, thus shielding them.

The so configured multi-layer printed circuit board sits on the stiffener 11, and the ground conductor traces 16a to 16c are soldered to the metal block 13.

So, the stiffener 11 is at the same time a thickened area which forms a multi-layer printed circuit board across which a via is provided extending from the lower surface to the printed circuit board 12.

The multi-layer printed circuit board defined by the thickened area or stiffener 11 is in the form of a rigid printed circuit board, whereas the printed circuit board 12 is preferably in the form of a single-layer flexible printed circuit board.

Thus, the further pin (10 in FIG. 3) can be connected on the lower surface of the stiffener 11, for connecting a monitor diode, for example.

Figure 7:
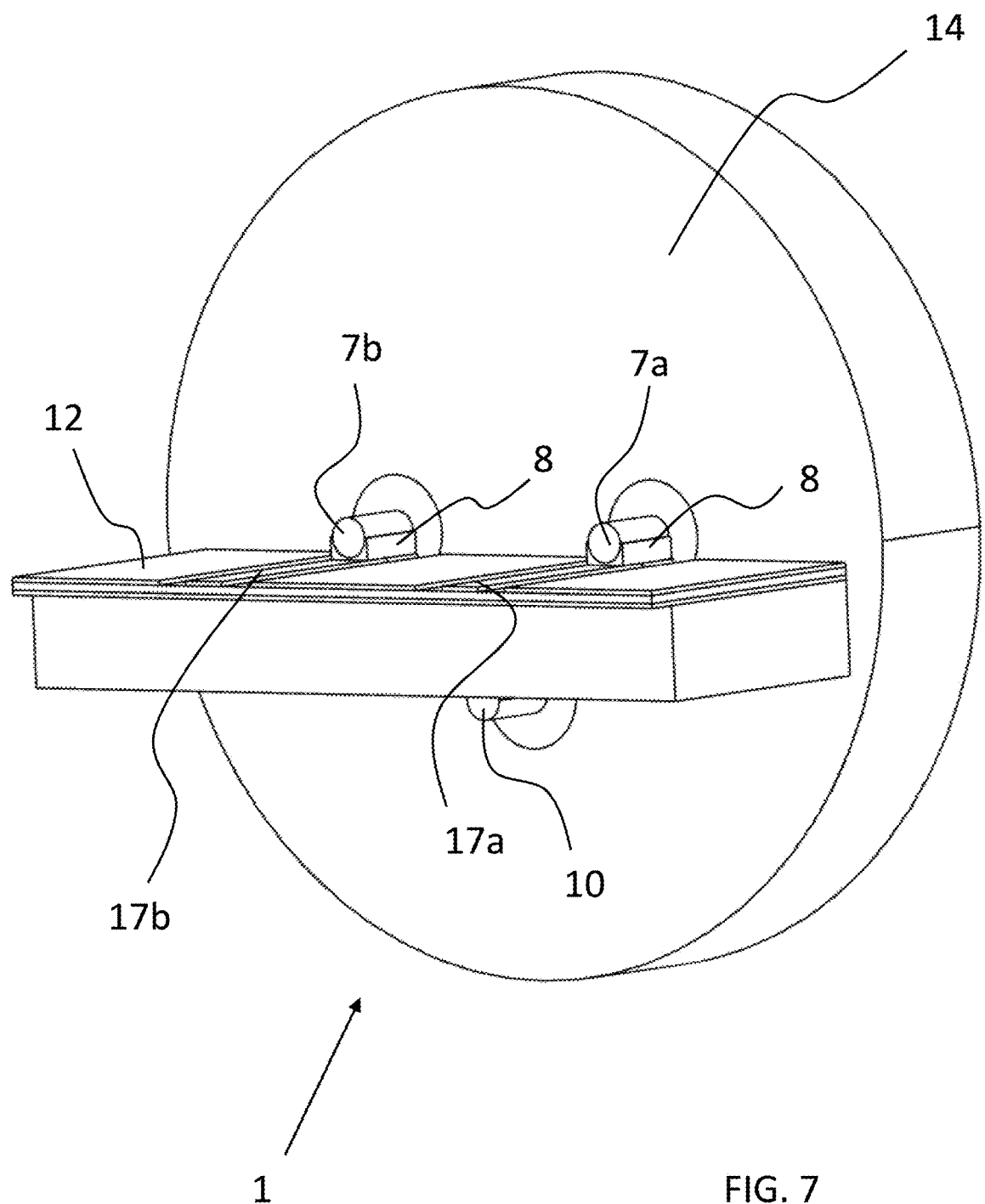
FIG. 7 is a perspective view of the lower surface of the header.

FIG. 7 is another perspective view of the lower surface of the TO package.

In this view, the metal block has been omitted. It can be clearly seen that the signal pins 7a, 7b protruding from the lower surface 14 are connected to the signal conductor traces 17a, 17b of the printed circuit board 12 by means of a solder 8.

FIG. 8 is a sectional view of a detail in the region of a feedthrough 9.

A signal pin 7 is disposed in the feedthrough 9 within an insulating material 18 made of glass.

For this purpose, the header 2 has a through-hole 23.

However, the feedthrough 9 or the through-hole 23 is only partially filled with the glass and/or glass ceramic insulating material 18, so that both adjacent to the lower surface 14 and adjacent to the upper surface 21 there is an area 22 free of the insulating material 18, which surrounds the signal pin 7 and which is not filled with the glass and/or glass ceramic insulating material 18.

On the inner side, a cavity 25 is existing in this non-filled area 22. Within the range of the cavity 25, an enlarged portion 19 of the signal pin 7 is provided.

Due to the enlarged portion 19 of the signal pin 7, the impedance jump caused by the changed permittivity is reduced.

On the outer side, the non-filled area 22 is filled with a plastic potting compound 24.

The plastic potting compound 24 preferably has a permittivity that is matched to the permittivity of the glass insulating material 18 that is used.

In particular, the plastic has a permittivity $\varepsilon_r$ of 4.0+/−2.5, more preferably +/−1.5.

A glass and/or glass ceramic that is preferably used as the glass or glass ceramic insulation material 18 has a permittivity $\varepsilon_r$ (at 18° C. and 50 Hz) of less than 6.0, preferably less than 5.0.

In particular a porous glass may be used, in particular a glass exhibiting a closed porosity of more than 30%, and/or a glass ceramic with these properties.

Except for the range of the enlarged portion 19, the signal pin 7 preferably has a diameter from 0.1 to 0.5 mm, more preferably from 0.2 to 0.3 mm.

The feedthrough 9 is filled with the glass and/or glass ceramic insulating material 18 preferably in 50 to 90%, more preferably in 60 to 80% of its volume.

The enlarged portion 19 preferably has a diameter that is at least 1.2 times, in particular 1.5 to 2.5 times that of the adjacent portion of the signal pin 7.

In the present embodiment, the enlarged portion 19 has a length from 0.02 to 0.2 mm, preferably from 0.05 to 0.1 mm.

The length of the feedthrough 9 may in particular amount to 0.5 to 2 mm, preferably 0.8 to 1.5 mm.

Figure 9:
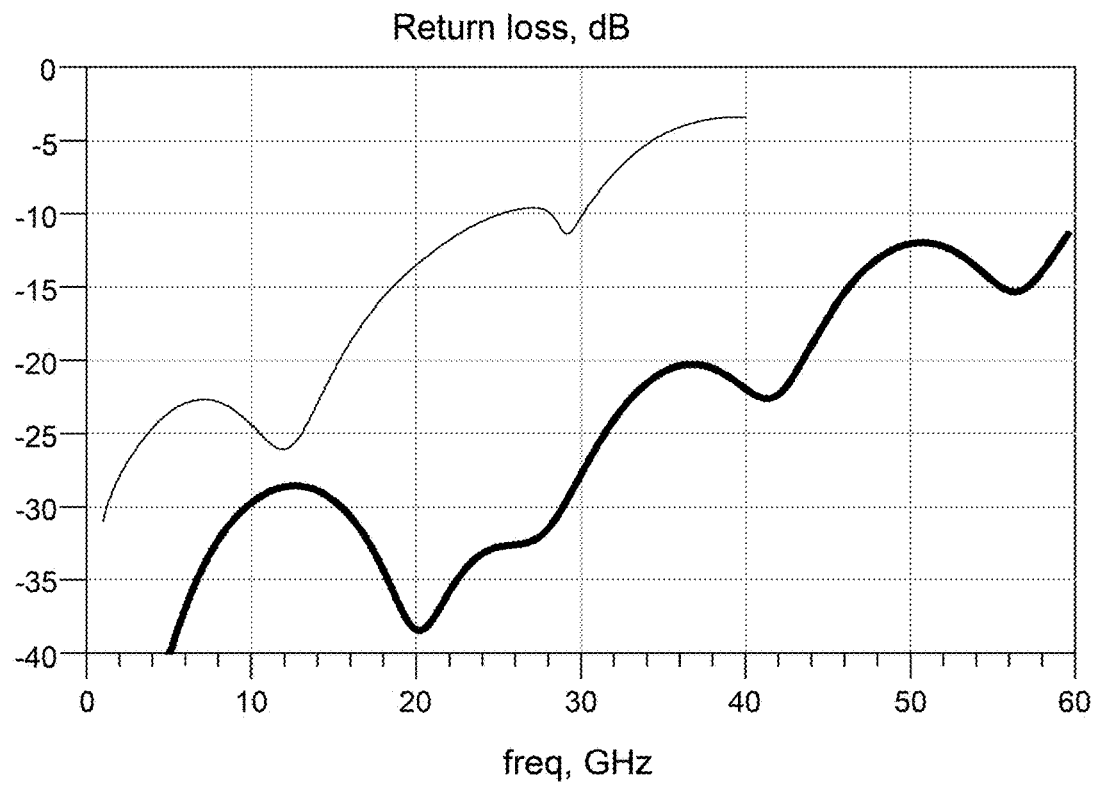
FIGS. 9 and 10 show graphs of return loss and insertion loss of the package illustrated in FIGS. 1 to 8 in comparison to a TO package known from the prior art.

FIG. 9 compares the return loss of a TO package known from the prior art (thin curve) with the return loss of a TO package according to the invention (thick curve). In particular, it can be seen that a return loss of about −10 dB has shifted from a frequency of about 30 GHz to about 50 GHz. So, the return loss is significantly improved.

Figure 10:
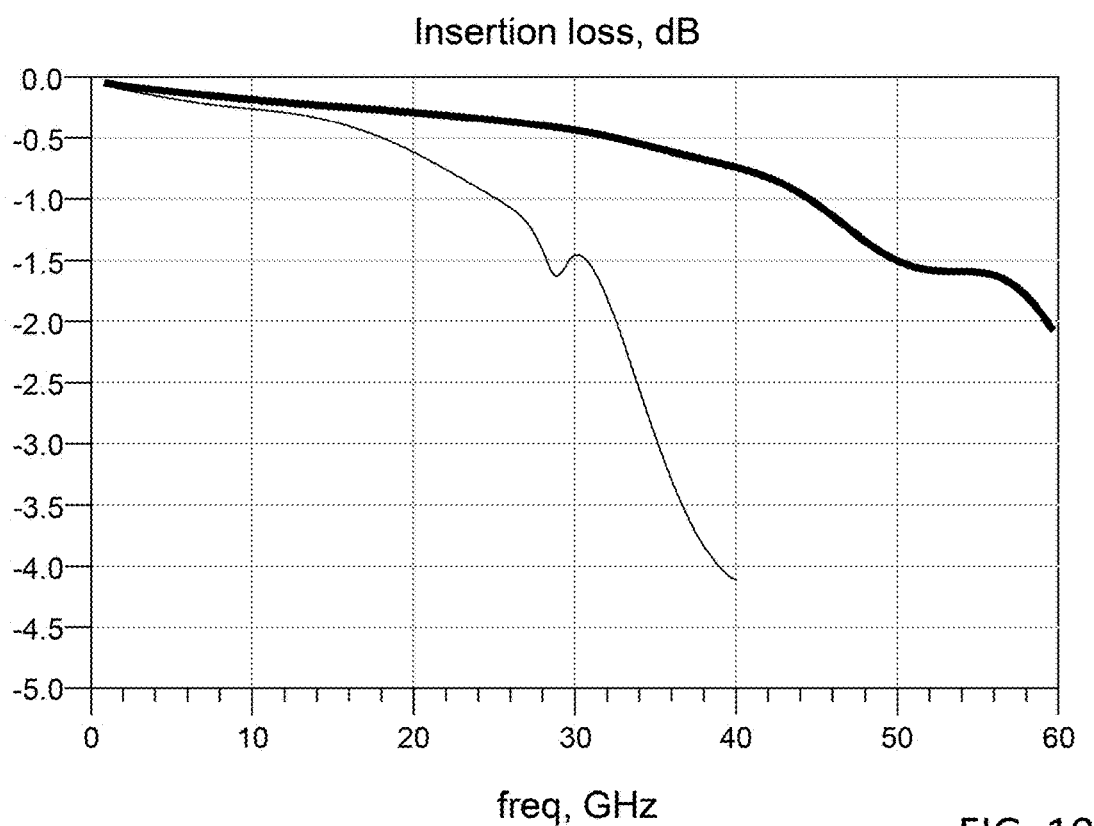

The same applies to the insertion loss, which is plotted for comparison in FIG. 10. An insertion loss of 2 dB is reached at just below 60 GHz instead of just over 30 GHz.

Thus, the invention enables to provide an approximately 25 GHz higher bandwidth.

Figure 11:
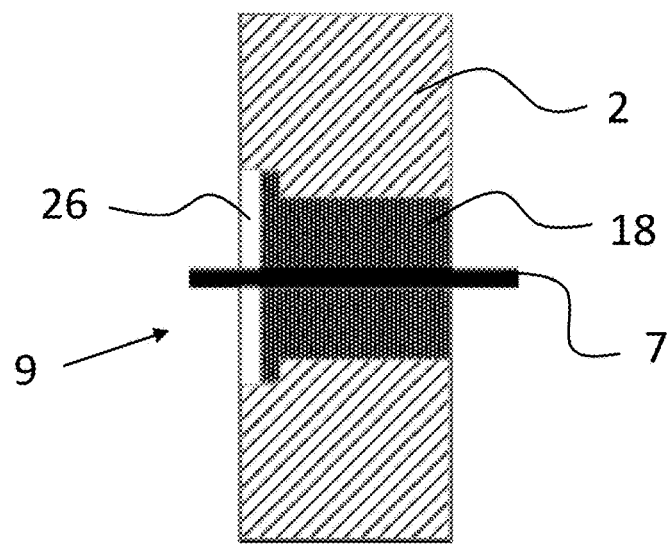
FIG. 11 is a sectional view of a feedthrough having an enlarged diameter on one side thereof.
Figure 12:
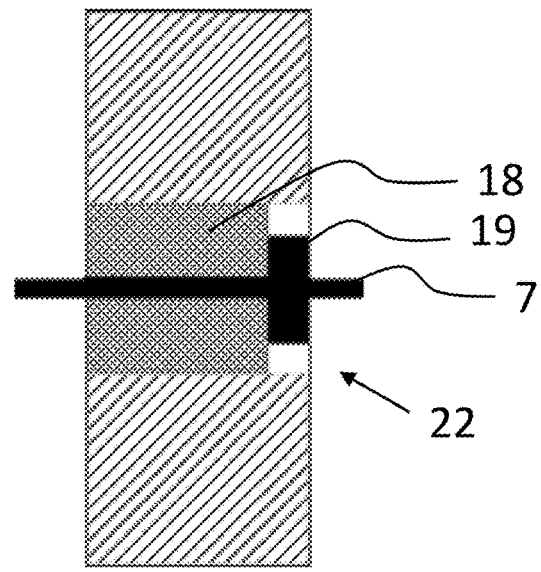
FIG. 12 is a sectional view of a feedthrough in which the signal pin has an enlarged portion on one side.
Figure 13:
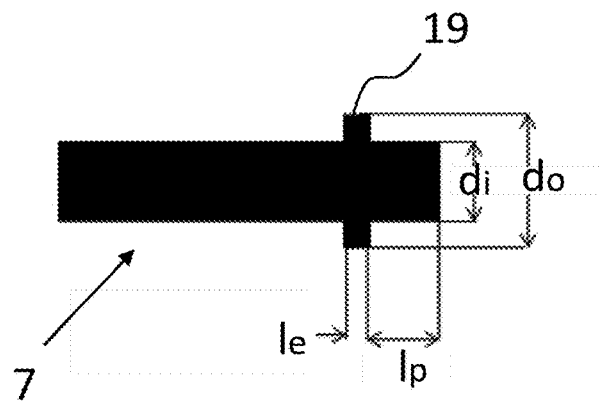
FIG. 13 is a detailed view of the signal pin.

Referring to FIGS. 11 to 13, further measures for adjusting the impedance profile of the feedthrough 9 will be explained in greater detail.

FIG. 11 is a schematic sectional view of another exemplary embodiment of a feedthrough 9 introduced into the header 12.

In this exemplary embodiment, a signal pin 7 is again embedded in an insulating material 18 made of glass and/or glass ceramic. On at least one side, the feedthrough 9 includes an area 26 of enlarged diameter.

The area 26 of enlarged diameter is partially filled with the glass and/or glass ceramic insulating material 18.

The area 26 of enlarged diameter provides a reservoir which can accommodate variations in volume of the insulating glass material 18.

Due to the enlarged diameter of area 26, the filling level will change only slightly in this case.

The insulating material 18 provided in area 26 forms a disk along which the impedance changes abruptly, which in turn reduces the impedance jump caused by the cavity thereabove.

The area of increased diameter preferably has a diameter that is at least 1.2 times that of the feedthrough 9 adjacent thereto, and has a length from 0.05 to 0.5 mm, preferably from 0.1 to 0.3 mm.

FIG. 12 shows another way of how impedance matching can be achieved, namely by providing the signal pin 7 with an enlarged portion 19 in the area 22 that is not filled with insulating material 18.

FIG. 13 is a detailed view of the signal pin 7.

In the not enlarged portion, the signal pin 7 has a diameter $d_i$ of preferably between 0.1 and 0.5 mm, most preferably between 0.2 and 0.3 mm.

In the present embodiment, the enlarged portion 19 has a stepped shape, i.e. it defines a circular cylindrical portion.

However, the enlarged portion 19 may also have a different shape, in particular it may have a chamfer at the front and/or rear end. In this way, the enlarged portion 19 would merge into the largest diameter $d_o$ not abruptly but gradually. This implies a gradually changing impedance profile.

The enlarged portion 19 has a diameter $d_o$ which preferably corresponds to at least 1.2 times the diameter $d_i$, more preferably 1.5 to 2.5 times the diameter $d_i$.

The enlarged portion 19 preferably has a length $l_e$ from 0.02 to 0.2 mm, more preferably from 0.05 to 0.1 mm.

The length of the adjoining projection $l_p$ is preferably from 0.2 to 0.5 mm.

Figure 14:
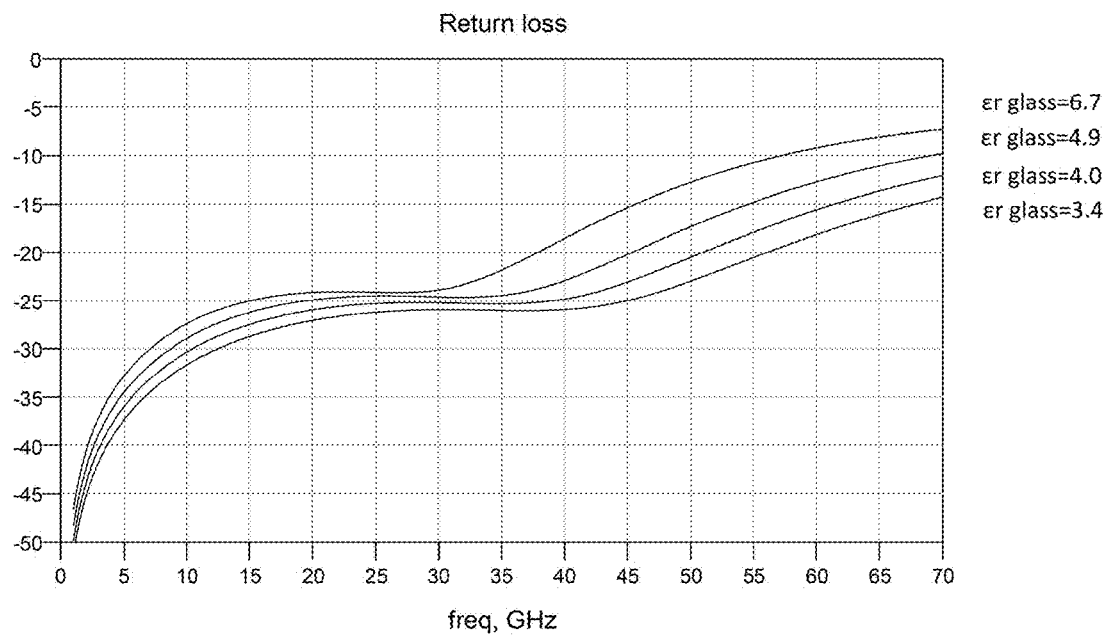
FIG. 14 shows graphs of return loss of TO packages according to the invention using different types of glass.

The graph of FIG. 14 shows the return loss of an exemplary embodiment of the invention in which a feedthrough was filled with a respective glass insulating material of different permittivity.

It can be seen that the return loss improves the lower the permittivity of the glass insulating material is.

Figure 15:
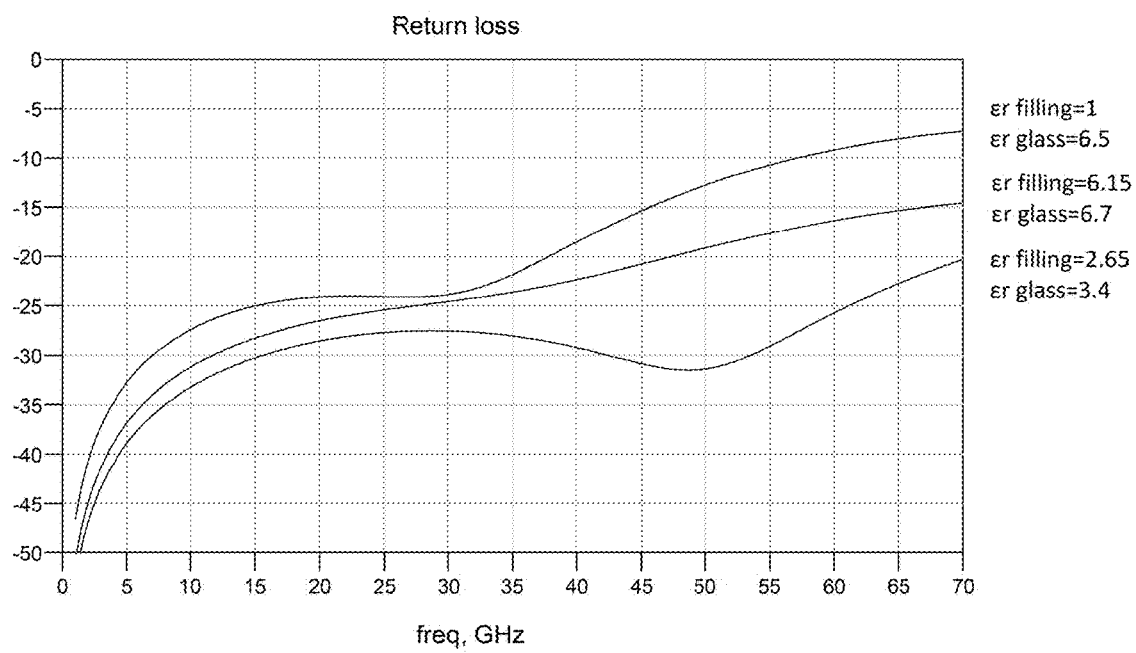
FIG. 15 shows graphs of return loss of TO packages according to the invention, in which the feedthrough is filled partly with glass, partly with a plastic material, using different types of glass and plastics.

FIG. 15 shows the return loss of a TO package according to the invention when different glasses are used as the insulation material and when different fillings are used for the area of the feedthrough without glass.

It can be seen that the return loss without filling ($\varepsilon_r$ filling=1 and $\varepsilon_r$ glass=6.5) is the worst.

Optimum return loss can be achieved by using a glass of low permittivity and at the same time using a filling having a permittivity that is matched to the permittivity of the glass.

Figure 16:
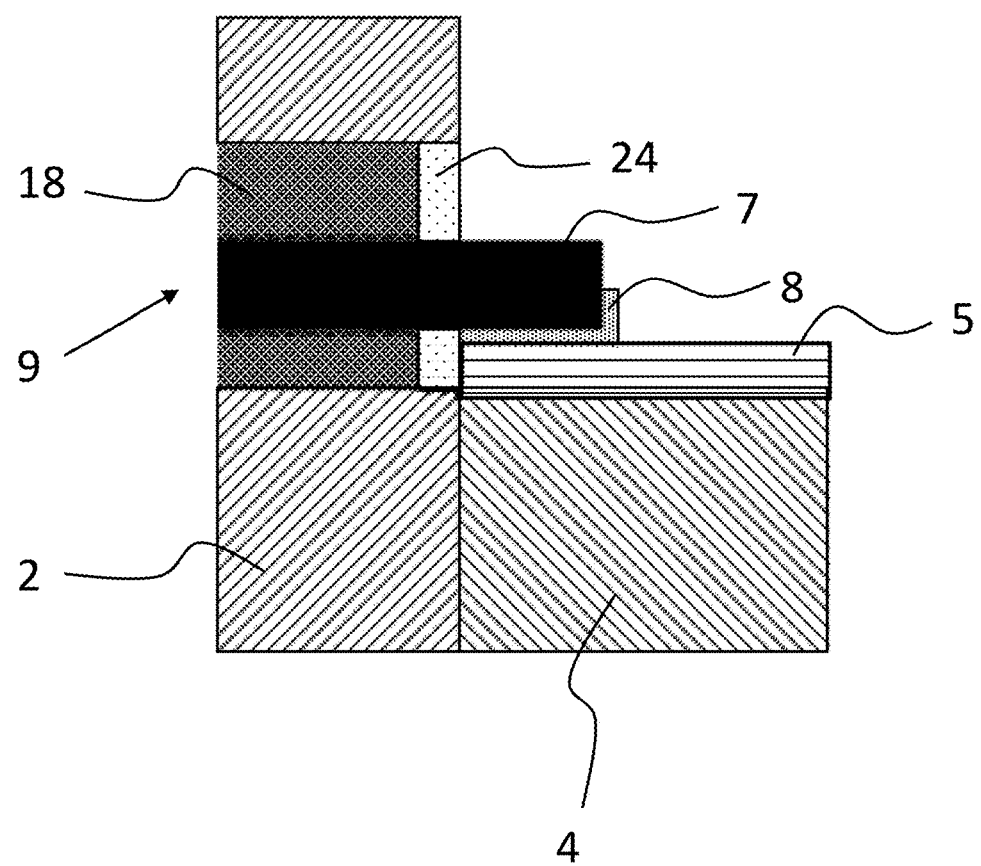
FIG. 16 is a sectional view of an exemplary embodiment of a header in the region of the feedthrough of the signal pin and of the submount for the optoelectronic component.

Referring to FIG. 16, it will be explained with reference to a schematic sectional view how a signal pin 7 can be introduced eccentrically into the feedthrough 9, for the purpose of impedance matching and/or for use of a thinner submount 5.

In this exemplary embodiment, a signal pin 7 is provided embedded in an insulating material 18 made of glass or glass ceramic, and the signal pin is connected to the submount 5 placed on pedestal 4 by means of a solder 8.

Feedthrough 9 is only partially filled with the glass insulating material 18.

Adjoining the glass insulating material 18, a recessed area is filled with a plastic potting compound 24.

It can be seen that the signal pin 7 is disposed in the feedthrough 9 in eccentric manner so as to be offset toward the submount 5.

The submount 5 preferably has a thickness from 0.05 to 2 mm, more preferably from 0.1 to 0.2 mm. The submount is preferably made of a ceramic, in particular of aluminum oxide or aluminum nitrite.

The central axis of the signal pin is preferably offset from the central axis of the feedthrough 9 by 0.01 to 0.15 mm, most preferably by 0.02 to 0.08 mm.

Submount 5 protrudes into the range of feedthrough 9, but is spaced from the signal pin 7 to allow solder 8 to flow in.

The spacing between signal pin 7 and submount 5 is preferably between 0.05 and 0.3 mm, more preferably between 0.1 and 0.2 mm.

Figure 17:
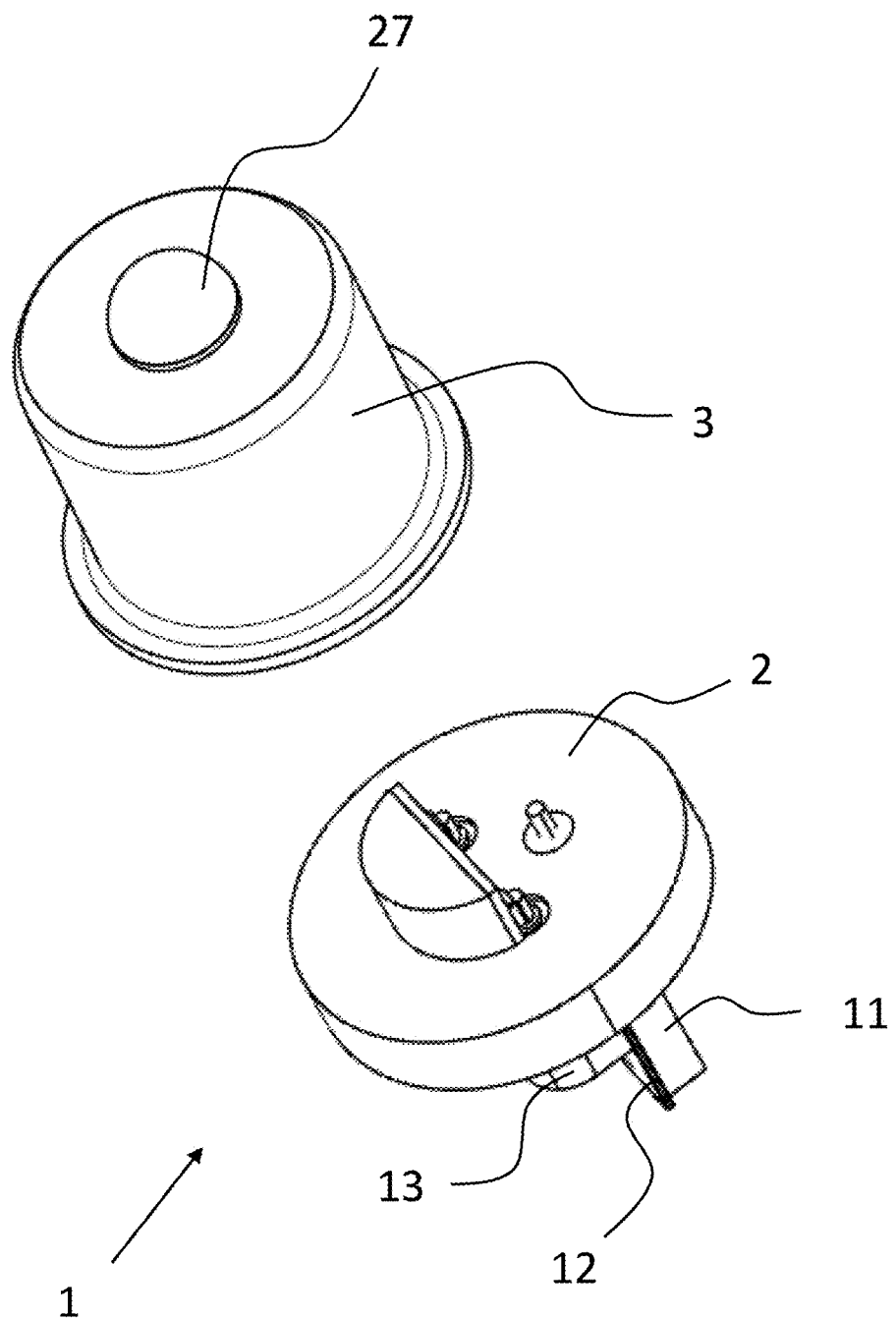
FIG. 17 is a perspective view of a TO package with cap.

FIG. 17 shows a perspective view of a kit for forming a TO package 1. In the exemplary embodiment of FIGS. 19 and 20, the glass sealing hole is partially filled with glass (not shown).

TO package 1 consists of header 2 and cap 3 in which a window 27 is provided. Window 27 is in particular in the form of a lens.

The header 2 may be equipped with at least one optoelectronic module, for example a laser diode or a monitor diode. Subsequently, the cap 3 is applied to the header, e.g. soldered or welded thereto.

Metal block 13 and printed circuit board 12 provided with the stiffener 11 may be attached after the cap 3 has been applied by soldering.

As described above, it is advantageous here that the connecting of signal pins 7 is decoupled from the establishing of a ground connection.

Figure 18:
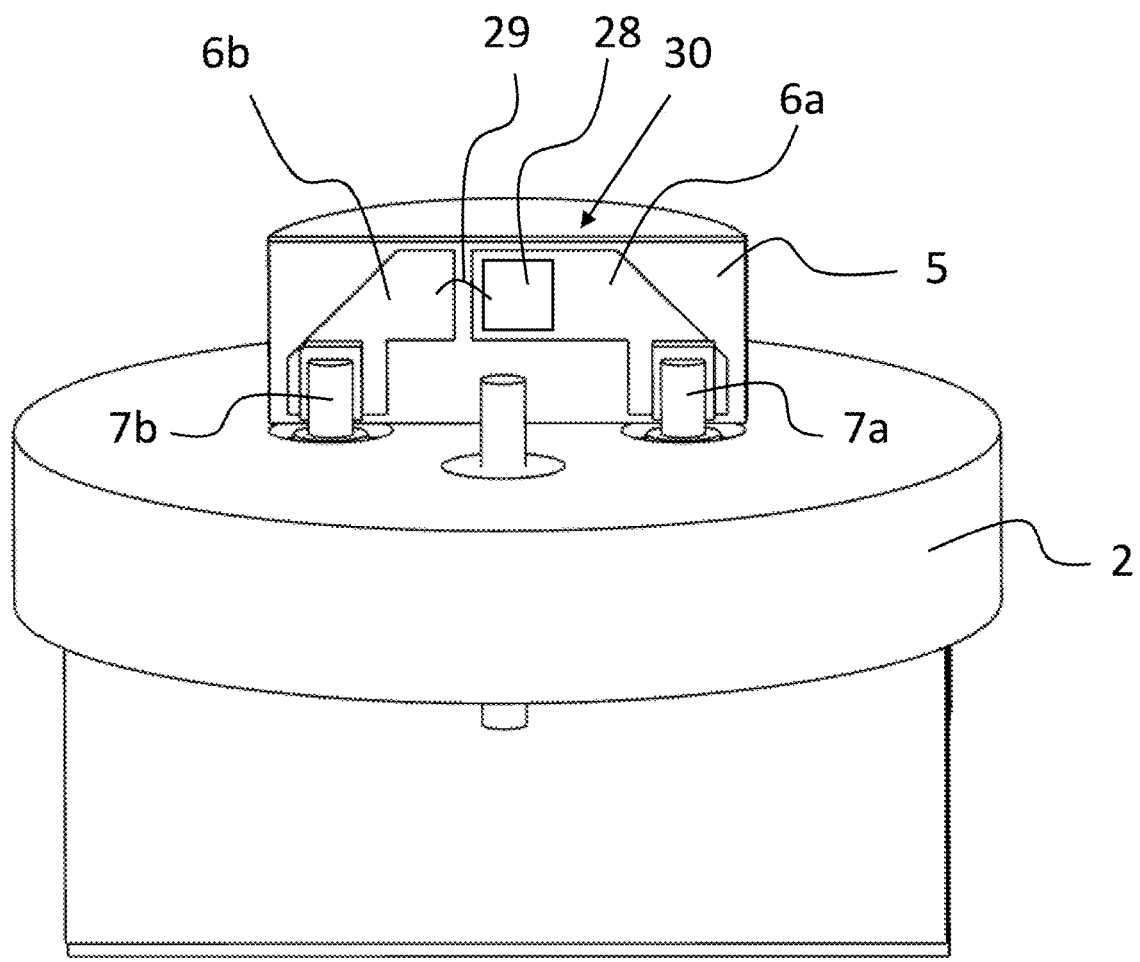
FIG. 18 shows the TO package equipped with an optoelectronic component.

FIG. 18 is a schematic view showing how the TO package 1 is equipped with a laser diode 28.

On submount 5, a mounting area 30 is provided.

In the present exemplary embodiment, the laser diode 28 is placed on the conductor trace 6a provided on the submount 5 and is thus connected to signal pin 7a.

In order to be electrically connected to signal pin 7b, a bonding wire 29 is provided connecting the laser diode 28 to the conductor trace 6b.

Since conductor traces 6a and 6b directly face each other, the length of the bonding wire 29 can be kept short, in particular at less than 0.5 mm.

Figure 19:
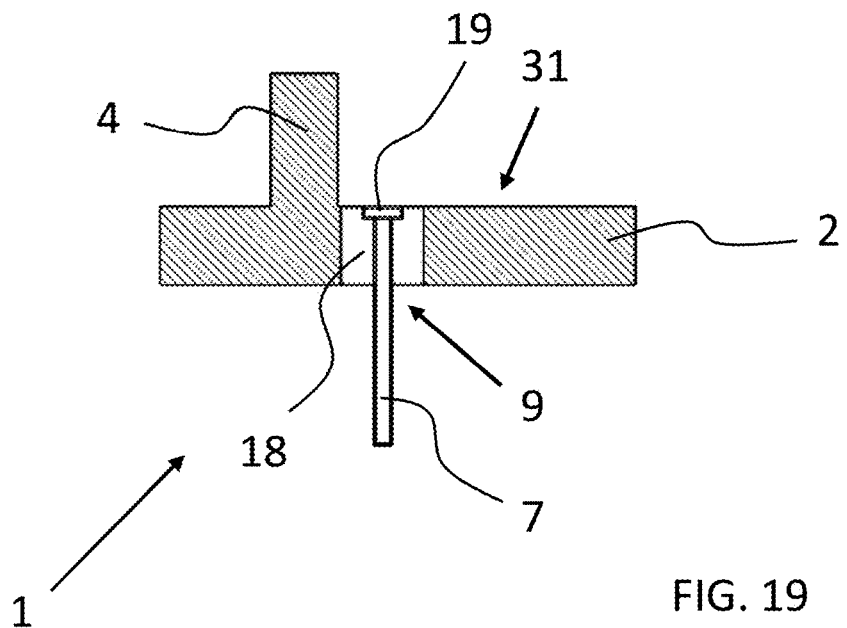
FIG. 19 is a schematic sectional view of a further embodiment of a TO package, in which the signal pin has an enlarged portion which is flush with the upper surface of the header.

FIG. 19 is a sectional view of a TO package 1 according to another aspect of the invention.

In this embodiment, as in the embodiments described above, the header 2 includes a pedestal 4 which serves to mount the submount.

On the side of the printed circuit board, not shown here, the TO package 1 may comprise a metal block (13 in FIG. 3). However, the invention also relates to a TO package 1 which does not comprise the metal block 13 described above.

According to the embodiment shown in FIG. 19, the signal pin 7 embedded in the insulating material 18 of feedthrough 9 is provided with an enlarged portion 19 on the front end thereof.

The enlarged portion 19 is approximately flush with the upper surface 31 of the header 2. This is understood to mean that the front face of the enlarged portion 19 is approximately at the same level with the adjacent upper surface 31.

Figure 20:
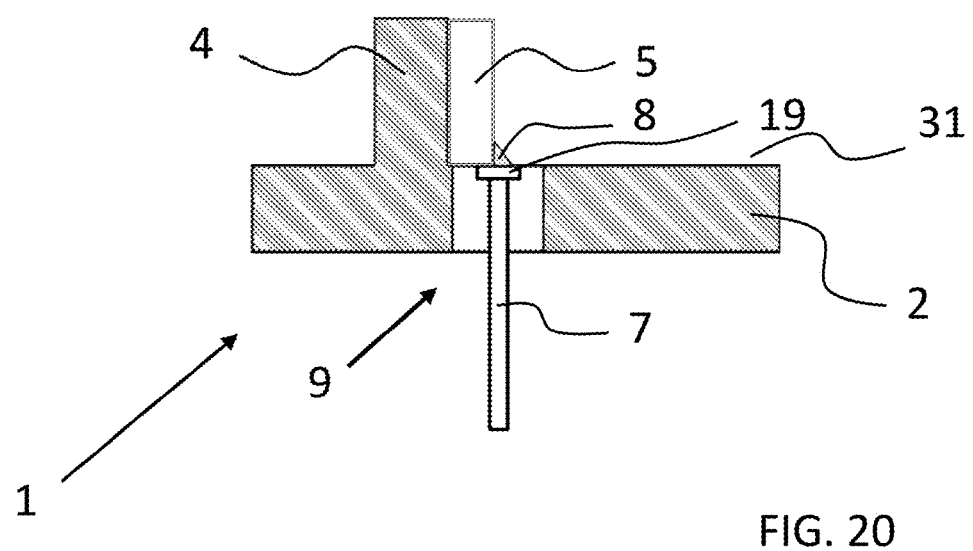
FIG. 20 shows the package of FIG. 19 with the submount mounted thereto.

FIG. 20 is a schematic sectional view of the TO package 1 shown in FIG. 19, in which the TO package 1 is equipped with a submount 5. The submount 5 is aligned coaxially with the signal pin 7.

Furthermore, the submount 5 protrudes into the range of the enlarged portion 19.

This makes it possible to connect the signal pin 7 not to the lateral side of submount 5 but rather to use the front face of the enlarged portion 19 as a connection area for the conductor trace (not shown) of the submount 5.

In order to provide an electrical connection, solder 8 is introduced in the form of a solder fillet, that is to say the solder connection is established along a corner defined by the conductor trace 6a, 6b of the submount 5 and the front face of enlarged portion 19.

The alignment between the enlarged portion 19 and the upper surface 31 of header 2 allows to minimize the gap width between the connection areas.

Compared to a signal pin 7 without enlarged portion 19, a smaller amount of solder 8 is required, so that it was possible to reduce the variance of the resistance of the solder joint in the high frequency range.

Figure 21:
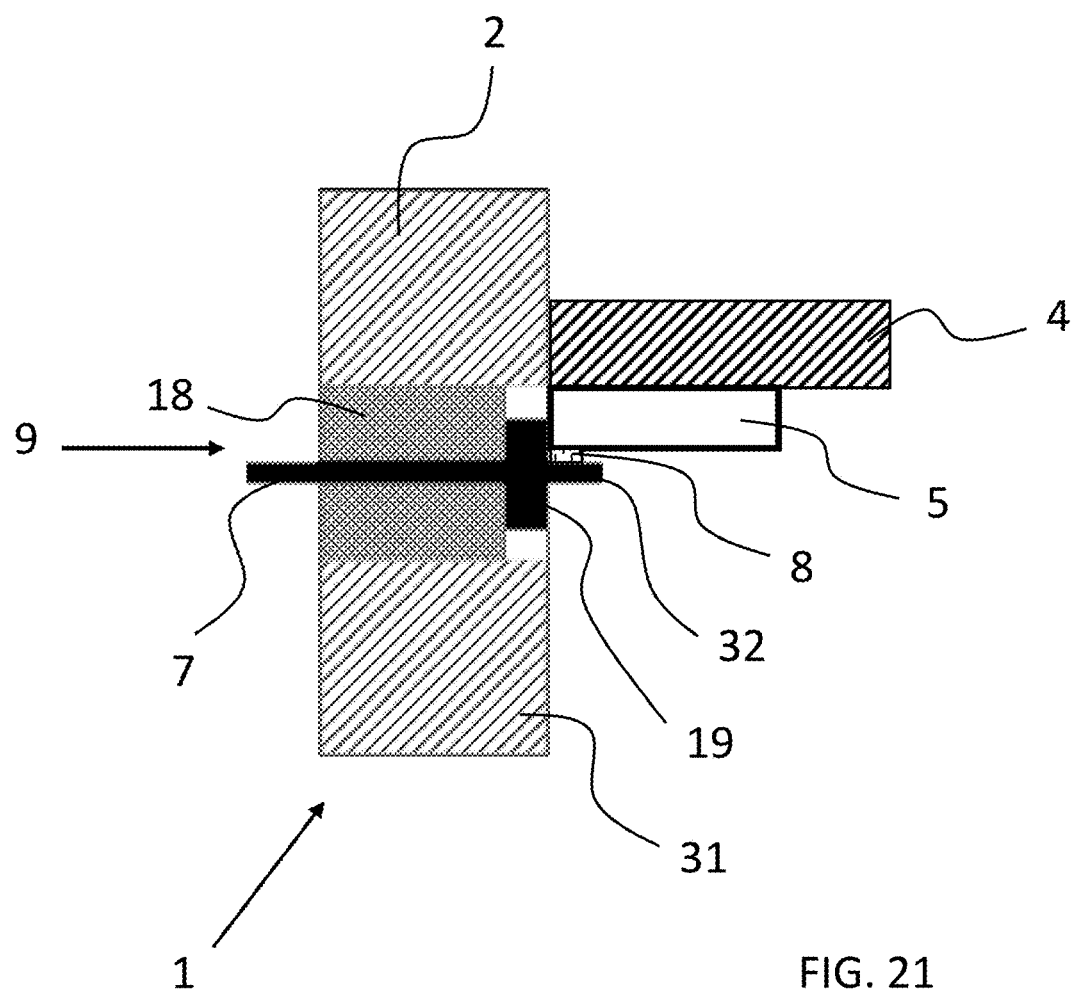
FIG. 21 is a further schematic view of a TO package with a signal pin that has an enlarged portion which is flush with the upper surface.

FIG. 21 is another sectional view of an embodiment of the invention.

Feedthrough 9 is essentially designed as in the embodiment illustrated in FIG. 12.

In contrast to the embodiment shown in FIGS. 19 and 20, the signal pin 7 has the extension 32 projecting beyond the enlarged portion 19.

The enlarged portion 19 is substantially flush with the upper surface 31 of the adjacent header 2.

The submount 5 mounted on pedestal 4 protrudes over a section of the enlarged portion 19. As described above, this allows to reduce the gap width of the electrical connection.

In contrast to the exemplary embodiment shown in FIGS. 19 and 20, however, submount 5 is connected laterally to the projection 32 of signal pin 7. Thus, the projection 32 defines a solder lug that allows to laterally connect the submount 5 to the projection 32 using a solder 8.

The signal pin 7 illustrated with reference to FIGS. 19 to 21 is preferably dimensioned in accordance with the view of FIG. 13, except for the fact that the projection 32 is not provided in the embodiment according to FIGS. 19 and 20.

Figure 22:
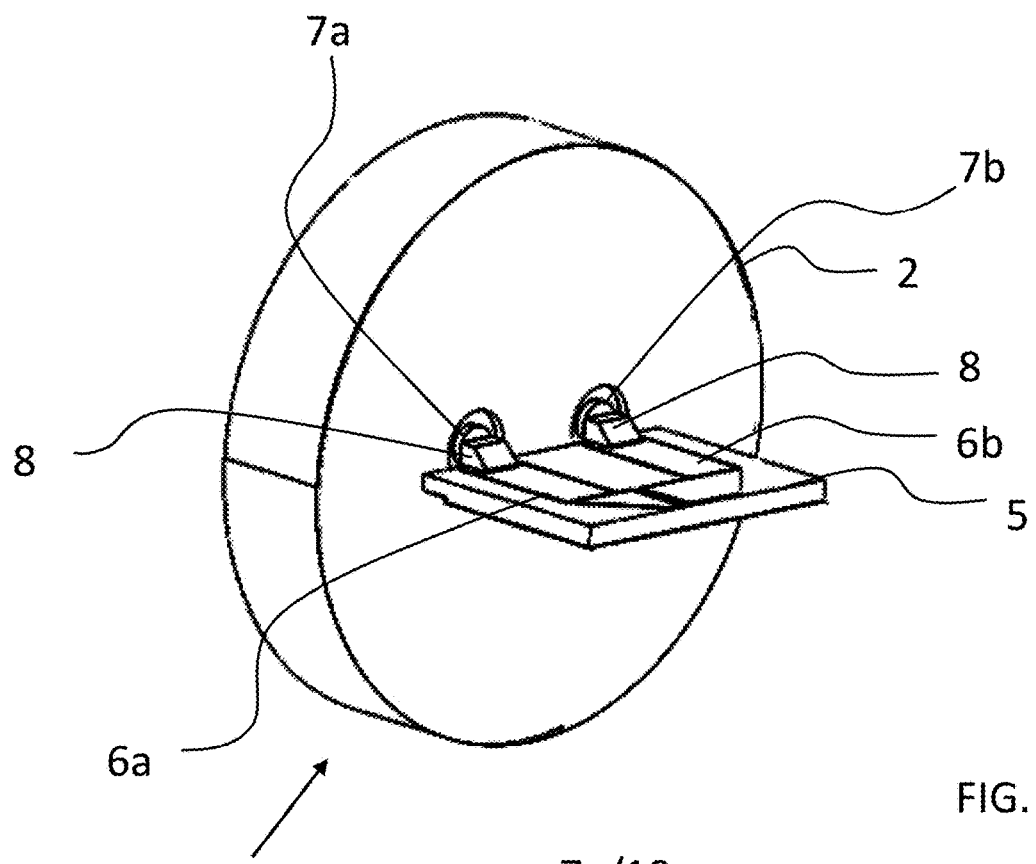
FIG. 22 is a perspective view of a TO package equipped with a submount and wherein the signal pins have an enlarged portion.
Figure 23:
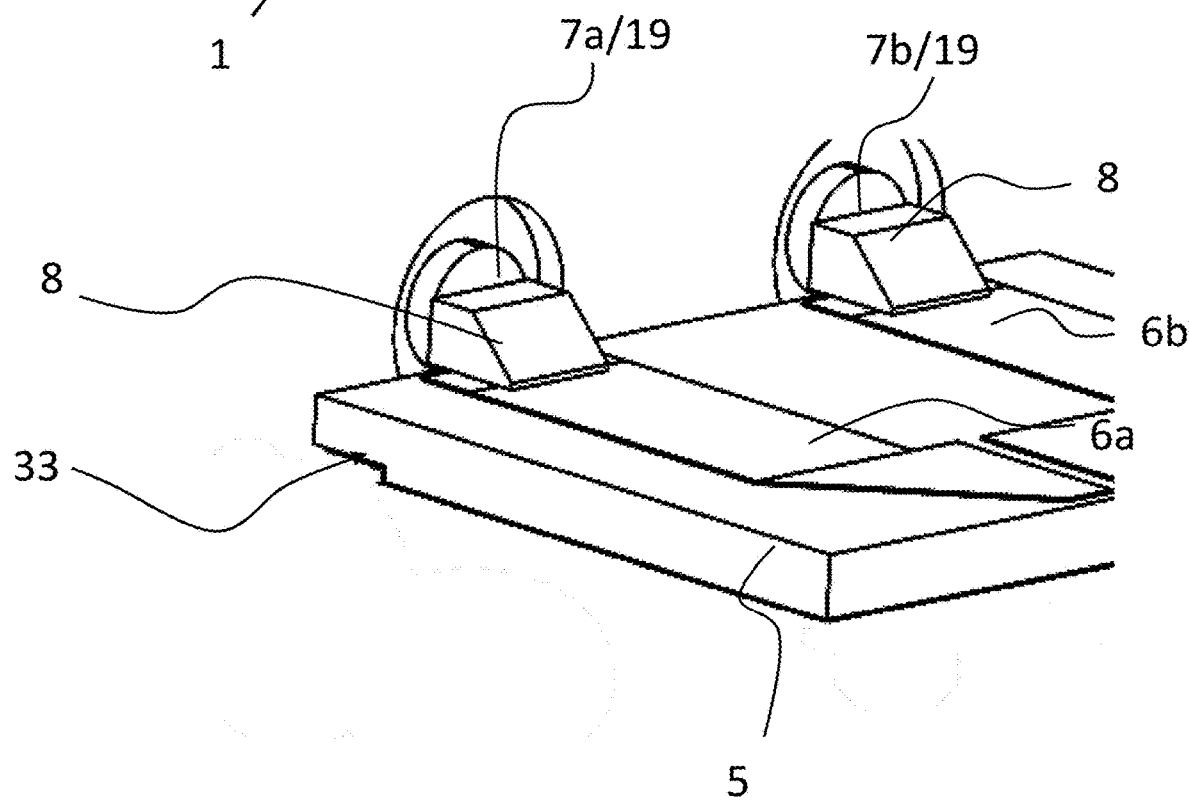
FIG. 23 is a view of a detail of FIG. 22 showing the front end area of the submount.
Figure 24:
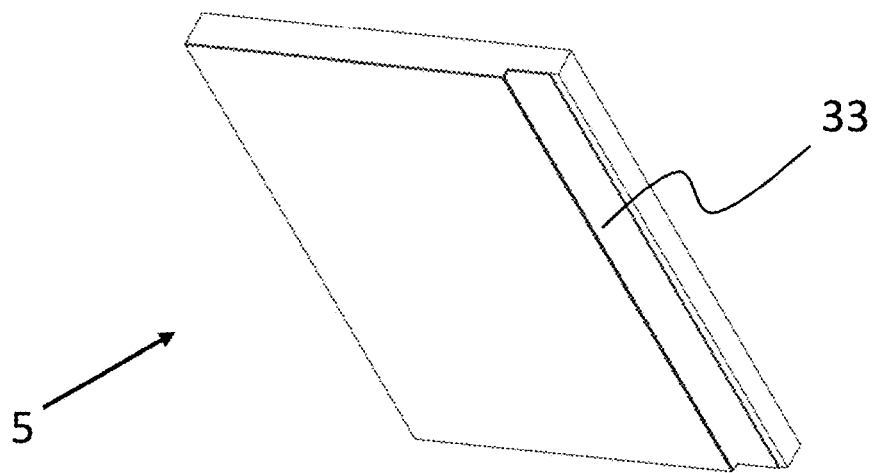
FIG. 24 is a perspective view only of the submount.

The submount 5 which is shown schematically in this view, preferably has a step 35 at a front end thereof, as shown in FIGS. 22 to 24 below.

FIG. 22 is a perspective wireframe graphic of an embodiment of a TO package 1 according to the invention.

The signal pins 7a, 7b are formed in accordance with the embodiment illustrated in FIGS. 19 and 20 so as to have an enlarged portion 19 which is flush with the upper surface 31 of header 2.

The conductor traces 6a, 6b of submount 5, which extend coaxially with the signal pins 7a, 7b are arranged on the signal pins 7a, 7b, and the resulting corner is soldered using a solder 8 that forms a solder fillet.

As can be seen in the detailed view according to FIG. 23, the submount 5 has a thinned area 33 at its front end on the side opposite the electrical connection to signal pins 7a, 7b.

So, the submount 5 is thinner at its front end, at least in the region of the connections.

In this way, the ground conductor trace 16a to 16d on the lower surface of the submount 5 opposite signal traces 17a, 17b comes closer toward conductor traces 6a, 6b which are used as signal conductor traces, which enables to reduce the impedance in the high-frequency range.

The thinned area 33 may be produced by laser milling, for example.

Since the thinned area 33 is only provided on the front end and preferably extends into the submount 5 to a maximum depth not exceeding the thickness of the submount 5, the mechanical stability of the submount 5 is not significantly affected.

Furthermore, it can be seen in the detail view that the width of the solder 8 corresponds approximately to the diameter of the enlarged portions 19.

FIG. 24 is a perspective view of only the submount 5.

The thinned area 33 on the front end of the submount 5 can be clearly seen. Through a step, it merges into the adjoining rest of the submount 5 which is thicker. Submount 5 is coated with a ground conductor trace on its lower surface, including in the thinned area 33. This ground conductor trace may in particular be formed as a deposited metal coating on the lower surface.

The illustrated submount 5 with thinned area 33 can be used for all embodiments of the invention, in particular also for the variant illustrated in FIG. 21, in which the signal pin 7 has a projection 32 for being connected laterally.

Figure 25:
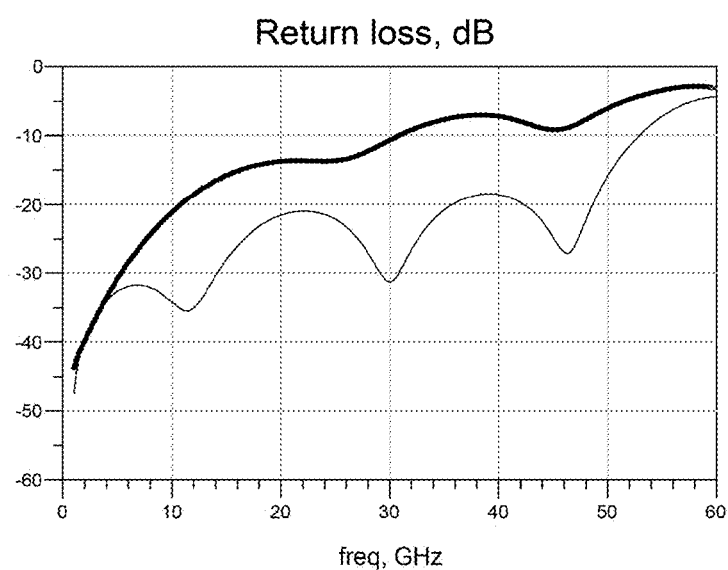
FIG. 25 shows, by way of two graphs, the return loss of the TO package 1 shown in FIGS. 22 and 23 in comparison with a TO package 1 which does not include signal pins 7 that have an enlarged portion 19 and a submount 5 with a thinned area. The fact that the thinned area is provided with ground trace 16a to 16d is of great importance and makes the difference to prior art solutions.

FIG. 25 is a graph showing the return loss of an exemplary embodiment of a TO package (lower, thin curve) which comprises a submount 5 with a thinned area at the front end according to the embodiment of FIGS. 22 and 23, and which includes signal pins 7 having an enlarged portion 19 and a front face that is used to connect the submount 5.

This is compared to the upper, thick curve of return loss of a TO package which does not have these two features, that means which has signal pins without enlarged portion, to which the submount is connected laterally, and in which the submount does not have a thinned area. Otherwise, however, this TO package is configured similarly.

As can be seen, it was possible to significantly improved the return loss, in particular in the frequency range between 10 and 50 GHz. In this frequency range, a shift in the return loss of about −10 dB on average could be achieved.

Figure 26:
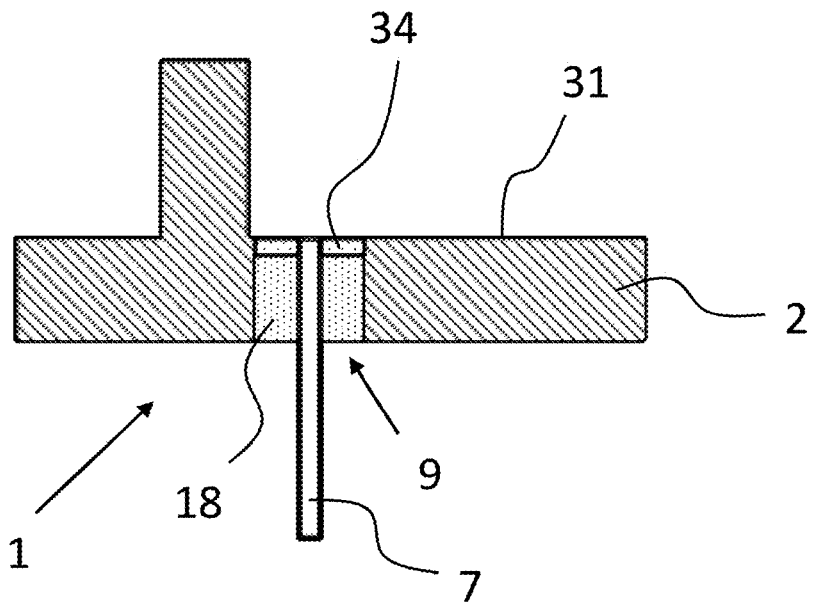
FIG. 26 is a schematic sectional view of a TO package in which the feedthrough has a covering of higher permittivity.

FIG. 26 is a schematic sectional view of a further exemplary embodiment of a TO package 1 in which the feedthrough 9 includes two regions of different permittivity.

On the inner side, a covering 34 preferably made of ceramic or glass ceramic is inserted in the feedthrough 9 adjacent to the upper surface 31.

The covering 34 is in the form of a perforated disk through which the signal pin 7 extends and which retains the glass or glass ceramic insulating material 18.

At the same time, the covering 34 has a higher permittivity $\varepsilon_r$ than the adjoining insulating material 18.

In this way, a local area of increased capacity is created.

In this embodiment of the invention it is conceivable to have the submount (not shown) connected to the front end of the signal pin 7 which terminates in the same plane with the upper surface 31 of the header 2 in this view.

According to another embodiment (not shown) it is also possible for the signal pin 7 to protrude into the TO package 1 and to be connected laterally to the submount.

Figure 27:
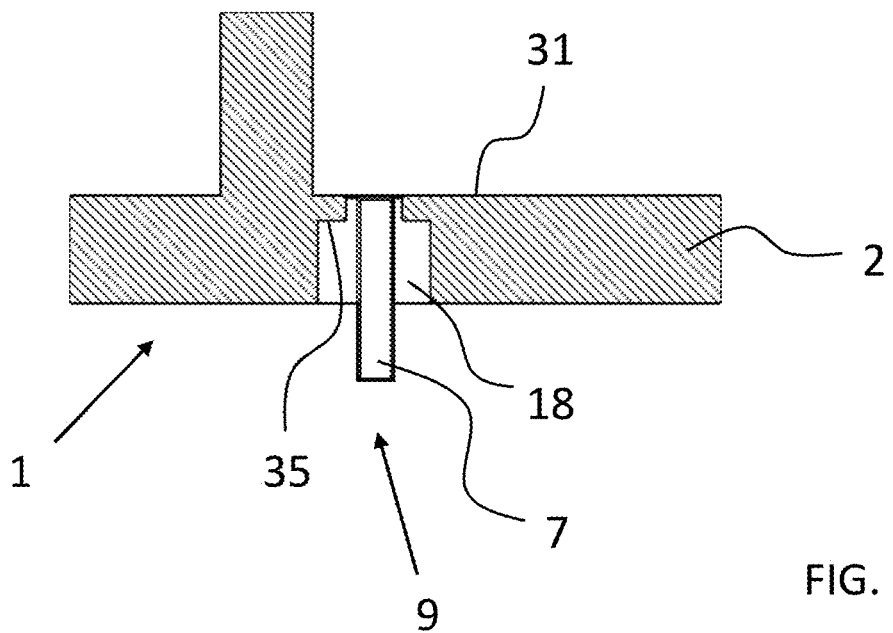
FIG. 27 is a schematic sectional view of a TO package in which the feedthrough has a step.

FIG. 27 is a schematic sectional view of another embodiment of a TO package 1 in which the feedthrough 9 has a step 35 that is provided below the upper surface 31.

Due to the step 35, the feedthrough 9 has a smaller diameter in an upper area adjacent to the upper surface 31.

On the one hand, the capacity of the feedthrough 9 can be locally increased in this way, in order to adjust the impedance profile of the signal path. At the same time, the locally reduced hole diameter of the feedthrough can contribute to a better accuracy of the filling level of the feedthrough 9 with insulating material 18.

FIGS. 28 to 30 show a further embodiment of a TO package 1 in which the enlarged portion 19 of the signal pin 7 is only partially arranged in the feedthrough 9.

FIG. 28 is a plan view of the TO package 1. The header 2 of the TO package 1 comprises a pedestal 4 on which the submount 5 is disposed.

FIG. 29 is a side view. This view in particular shows the conductor traces 6a, 6b of the submount 5, through which an optoelectronic component (not shown) can be electrically connected.

FIG. 30 is a sectional view taken along line A-A of FIG. 29.

Signal pin 7 terminates in an enlarged portion 19. Submount 5 is connected to the front face of the enlarged portion 19. In order to provide a mechanically stable connection featuring a low variance in impedance, a solder fillet 8 is provided for connecting the submount 5 to the signal pin 7, which provides two-dimensional contacting.

In this embodiment of the invention, the enlarged portion 19 is not terminating flush with the upper surface of the header 2, but rather protrudes upwards therefrom and thus protrudes into the package.

The purpose of reducing the gap width at the end of the feedthrough 9 is still achieved.

The submount 5 is preferably thinned on the front end thereof, in accordance with the embodiment of FIGS. 22 to 24, that is to say it has a step 35 so that it has a smaller thickness in a front end area (not shown).

The invention permitted to provide, in a simple manner, a TO package 1 which allows for significantly higher data transfer rates.

LIST OF REFERENCE NUMERALS

| | |
|---|---|
| 1 | TO package |
| 2 | Header |
| 3 | Cap |
| 4 | Pedestal |
| 5 | Submount |
| 6a, 6b | Conductor traces |
| 7, 7a, 7b | Signal pin |
| 8 | Solder/solder fillet |
| 9 | Feedthrough |
| 10 | Pin |
| 11 | Stiffener, thickened area |
| 12 | Printed circuit board |
| 13 | Metal block |
| 14 | Lower surface |
| 15a, 15b | Arch |
| 16a-16d | Ground conductor traces |
| 17a, 17b | Signal conductor trace |
| 18, 18a, 18b | Insulating material |
| 19, 19a, 19b | Enlarged portion of signal pin |
| 20 | Via |
| 21 | Upper surface of header |
| 22 | Area not filled with filling material |
| 23 | Through-hole of header |
| 24 | Plastic potting compound |
| 25 | Cavity |
| 26 | Area of enlarged diameter |
| 27 | Window |
| 28 | Laser diode |
| 29 | Bonding wire |
| 30 | Mounting area |
| 31 | Upper surface |
| 32 | Projection |
| 33 | Thinned area |
| 34 | Covering |
| 35 | Step |

What is claimed is:

1. A transistor outline package, comprising
a header having an upper surface, a lower surface, an inner surface, and a mounting area for an optoelectronic component in the inner surface;
a signal pin configured to connect an optoelectronic component, wherein the signal pin is disposed in a feedthrough and protrudes from the lower surface; and
a printed circuit board attached on the signal pin substantially coaxially thereto, wherein the printed circuit board is mechanically and electrically connected to the header by a metal block arranged adjacent to the feedthrough to provide grounding, and wherein the metal block is connected to an upper surface of the printed circuit board on the one side and to a lower surface of the header on the other side.

2. The transistor outline package of claim 1, wherein the metal block is a solid metal plate or is a bridge that extends over the signal pin.

3. The transistor outline package of claim 1, wherein the printed circuit board is a flexible printed circuit board.

4. The transistor outline package of claim 1, wherein the printed circuit board comprises a stiffener below the metal block.

5. The transistor outline package of claim 1, wherein the printed circuit board is a multi-layer board, the transistor outline package further comprising a ground conductor below a signal conductor trace and/or between signal conductor traces.

6. The transistor outline package of claim 1, wherein the signal pin comprises two signal pins disposed in a different feedthroughs.

7. The transistor outline package of claim 1, wherein the mounting area is on a submount that is electrically connected via the signal pin.

8. The transistor outline package of claim 7, wherein the submount sits on a pedestal of the header.

9. The transistor outline package of claim 1, wherein the signal pin is arranged adjacent to a submount, wherein the signal pin is disposed in the feedthrough eccentrically offset toward the submount.

10. The transistor outline package of claim 1, wherein the feedthrough is filled with an insulating material having a relative permittivity at 18° C. and 50 Hz of less than 6.0.

11. The transistor outline package of claim 10, further comprising a further insulating material arranged adjacent to the insulating material, the further insulating material having a relative permittivity at 18° C. and 50 Hz that is greater than that of the insulating material.

12. The transistor outline package of claim 1, wherein the printed circuit board is thickened adjacent to the lower surface.

13. The transistor outline package of claim 1, wherein the signal pin has an enlarged portion with a section arranged within the feedthrough.

14. The transistor outline package of claim 13, wherein the enlarged portion is flush with an upper surface adjacent to the feedthrough.

15. The transistor outline package of claim 13, wherein the signal pin is connected to a submount by an electrically conductive material.

16. The transistor outline package of claim 15, wherein the signal pin is connected to the submount at a lateral surface thereof.

17. The transistor outline package of claim 13, wherein the signal pin has a connection area for the optoelectronic component that is defined by a front face of the enlarged portion.

18. The transistor outline package of claim 13, wherein the feedthrough is filled with an insulating material comprising glass and/or glass ceramic, wherein the insulating material extends around the enlarged portion.

19. The transistor outline package of claim 1, further comprising a submount for the optoelectronic component, wherein the submount has a conductor trace that extends coaxially with the signal pin, and wherein the conductor trace is soldered to a front face of the signal pin.

20. The transistor outline package of claim 19, wherein the submount has a thinned area below the conductor trace, the thinned area comprising a ground conductor trace.

21. The transistor outline package of claim 19, wherein the submount extends over at least a section of an enlarged portion of the signal pin.

22. The transistor outline package of claim 1, wherein the feedthrough has a step below the upper surface.

23. The transistor outline package of claim 1, wherein the feedthrough has a covering comprising a dielectric material on at least one side thereof.

24. The transistor outline package of claim 1, wherein the signal pin is connected to the header so as to be decoupled from the grounding.

25. A transistor outline package, comprising
- a header having an upper surface, a lower surface, an inner surface, and a mounting area for an optoelectronic component in the inner surface;
- a signal pin configured to connect an optoelectronic component, wherein the signal pin is disposed in a feedthrough and protrudes from the lower surface; and
- a printed circuit board attached on the signal pin substantially coaxially thereto, wherein the printed circuit board is mechanically and electrically connected to the header by a metal block arranged adjacent to the feedthrough to provide grounding, and
- wherein the feedthrough is filled with an insulating material made of glass and/or glass ceramic, wherein the feedthrough has an area on at least one side that is not filled with the insulating material.

26. The transistor outline package of claim 25, wherein the signal pin has an enlarged portion in the area and/or where in the area is filled with a plastic material.

\* \* \* \* \*